US011476808B2

(12) United States Patent
Pratt et al.

(10) Patent No.: US 11,476,808 B2
(45) Date of Patent: Oct. 18, 2022

(54) MULTI-COMPONENT DIGITAL PREDISTORTION

(71) Applicant: Analog Devices International Unlimited Company, Limerick (IE)

(72) Inventors: Patrick Pratt, Mallow (IE); David Jennings, Bristol (GB)

(73) Assignee: Analog Devices International Unlimited Company, Limerick (IE)

( * ) Notice: Subject to any disclaimer, the term of this patent is extended or adjusted under 35 U.S.C. 154(b) by 0 days.

(21) Appl. No.: 16/992,902

(22) Filed: Aug. 13, 2020

(65) Prior Publication Data
US 2022/0052653 A1 Feb. 17, 2022

(51) Int. Cl.
*H03F 1/32* (2006.01)
*H03F 3/24* (2006.01)
(Continued)

(52) U.S. Cl.
CPC ............. *H03F 1/3247* (2013.01); *H03F 3/24* (2013.01); *H04B 1/0475* (2013.01); *H04L 27/368* (2013.01); *H03F 2201/3233* (2013.01)

(58) Field of Classification Search
CPC ... H04B 1/0475; H04L 27/368; H03F 1/3247; H03F 3/24
(Continued)

(56) References Cited

U.S. PATENT DOCUMENTS 5,808,511 A 9/1998 Kobayashi
8,154,432 B2 4/2012 Kaper et al.
(Continued)

FOREIGN PATENT DOCUMENTS

WO 2010054499 5/2010
WO 2014085097 6/2014
(Continued)

OTHER PUBLICATIONS

"NanoSemi, N.A.T. and Fraunhofer HHI at NGMN Industry Forum: Massive MIMO SDR Demonstration with Linearized Power Amplifiers", 10th NGMN Industry Conference and Exhibition, Frankfurt: Oct. 12-13, 2016, [Online]. [Retrieved on Nov. 15, 2016], Retrieved from the Internet: <URL: http://www.nanosemitech.com/nanosemi-n-t-fraunhofer-hhi-ngmn-industry-forum-massive-mimo-sdr-demonstration-linearized-power-amplifiers/>, (2016), 5 pgs.
(Continued)

*Primary Examiner* — Kevin M Burd
(74) *Attorney, Agent, or Firm* — Schwegman Lundberg & Woessner, P.A.

(57) ABSTRACT

Various examples are directed to systems and methods for operating a plurality of power amplifiers. A predistortion circuit may pre-distort an input signal according to a predistortion configuration to generate a pre-distorted signal for the plurality of power amplifiers. An adaption circuit may receive a first feedback signal from a first power amplifier of the plurality of power amplifiers and generate predistortion correlation data describing a correlation between parameters of a model describing the plurality of power amplifiers. The adaption circuit may receive a first feedback signal from a second power amplifier of the plurality of power amplifiers and update the predistortion correlation data to generate updated predistortion correlation data using the first feedback signal from the second power amplifier. The adaption circuit may also generate the predistortion configuration using the updated predistortion correlation data.

17 Claims, 11 Drawing Sheets

(51) Int. Cl.
*H04B 1/04* (2006.01)
*H04L 27/36* (2006.01)

(58) Field of Classification Search
USPC .......................................................... 375/297
See application file for complete search history.

(56) References Cited

U.S. PATENT DOCUMENTS

| | | | |
|---|---|---|---|
| 8,829,993 | B2 | 9/2014 | Briffa et al. |
| 9,923,582 | B2 | 3/2018 | Lee et al. |
| 10,033,413 | B2 | 7/2018 | Pratt |
| 10,224,970 | B2 | 3/2019 | Pratt |
| 10,320,340 | B1* | 6/2019 | Pratt ................... H04L 25/49 |
| 10,480,970 | B2 | 11/2019 | Li |
| 10,686,415 | B2 | 6/2020 | Pratt et al. |
| 10,715,702 | B1* | 7/2020 | Zhao .................... H04L 25/03 |
| 2010/0020899 | A1 | 1/2010 | Szopko et al. |
| 2010/0253426 | A1 | 10/2010 | Su et al. |
| 2013/0166259 | A1 | 6/2013 | Weber et al. |
| 2015/0372646 | A1 | 12/2015 | Briffa et al. |
| 2016/0087604 | A1 | 3/2016 | Kim |
| 2018/0191314 | A1 | 7/2018 | Pratt et al. |
| 2019/0028068 | A1* | 1/2019 | Schemmann ............ H03F 3/68 |
| 2020/0287578 | A1* | 9/2020 | Choi ...................... H03F 3/19 |
| 2020/0395662 | A1* | 12/2020 | Tervo ................... H04B 17/13 |

FOREIGN PATENT DOCUMENTS

| | | |
|---|---|---|
| WO | 2018126010 | 7/2018 |
| WO | 2018126010 | 8/2018 |
| WO | WO-2018224161 A1 | 12/2018 |
| WO | WO-2020138830 A1 | 7/2020 |

OTHER PUBLICATIONS

"International Application Serial No. PCT/US2017/068715, Invitation to Pay Add'l Fees and Partial Search Report dated Apr. 9, 2018", 12 pgs.

"International Application Serial No. PCT/US2017/068715, International Search Report dated Jun. 18, 2018", 6 pgs.

"International Application Serial No. PCT/US2017/068715, Written Opinion dated Jun. 18, 2018", 10 pgs.

"U.S. Appl. No. 15/856,985, Non Final Office Action dated Jan. 10, 2019", 11 pgs.

"U.S. Appl. No. 15/856,985, Response filed May 10, 2019 to Non Final Office Action dated Jan. 10, 2019", 15 pgs.

"U.S. Appl. No. 15/856,985, Examiner Interview Summary dated Jun. 13, 2019", 3 pgs.

"U.S. Appl. No. 15/856,985, Non Final Office Action dated Aug. 7, 2019", 10 pgs.

"U.S. Appl. No. 15/856,985, Response filed Dec. 9, 2019 to Non Final Office Action dated Aug. 7, 2019", 11 pgs.

"U.S. Appl. No. 15/856,985, Notice of Allowance dated Feb. 11, 2020", 6 pgs.

Amin, Shoaib, "Behavioral Modeling and Linearization of Crosstalk and Memory Effects in RF MIMO Transmitters", IEEE Transactions on Microwave Theory and Techniques, 62(4), (Apr. 2014), 810-823.

Cao, Haiying, "Digital Predistortion for Dual-Input Doherty Amplifiers", Proceedings, IEEE Topical Conference on Power Amplifiers for Wireless and Radio Applications, PAWR 2012, Santa Clara, CA, Jan. 15-18, 2012, (2012), 45-48.

Lee, Sangil, "Digital Predistortion for Power Amplifiers in Hybrid MIMO Systems with Antenna Subarrays", 2015 IEEE 81st Vehicular Technology Conference (VTC Spring), (2015), 5 pgs.

"International Application Serial No. PCT/EP2021/072614, International Search Report dated Oct. 12, 2021", 5 pgs.

"International Application Serial No. PCT/EP2021/072614, Written Opinion dated Oct. 12, 2021", 8 pgs.

Chen, Long, et al., "Linearization of a Directional Modulation Transmitter Using Low-Complexity Cascaded Digital Predistortion", IEEE Transactions on Microwave Theory and Techniques, Plenum, USA, vol. 67, No. 11, (Nov. 1, 2019), 4467-4478.

Zhiliang, Zhang, et al., "An Improved Cross Talk Cancelling Digital Predistortion for MIMO Transmitters", Hindawi, Mobile Information Systems, vol. 2016, (Jan. 1, 2016), 1-7.

* cited by examiner

MULTI-COMPONENT DIGITAL PREDISTORTION

TECHNICAL FIELD

This document pertains generally, but not by way of limitation, to integrated circuits and communication systems, and particularly, but not by way of limitation to digital predistortion for non-linear components, such as power amplifiers.

BACKGROUND

Communications over wired media, such as coaxial cable and over wireless media, such as RF transmission, often use a power amplifier (PA) in a transmitter to produce a signal for transmission over the medium. The PA circuit may include a PA with a nonlinear gain characteristic, such as gain compression, that occurs at higher power output levels. The nonlinear gain characteristic can lead to signal distortion at the higher power levels. Digital predistortion (DPD) is used to compensate for amplifier nonlinearities. A DPD circuit applies predistortion to the amplifier input signal. The predistortion is determined using an inverse model of the amplifier's transfer characteristic, including distortion terms. A goal of the predistortion is to reduce distortion in the transmitted signal due to the PA gain nonlinearity.

BRIEF DESCRIPTION OF THE DRAWINGS

In the drawings, which are not necessarily drawn to scale, like numerals may describe similar components in different views. Like numerals having different letter suffixes may represent different instances of similar components. The drawings illustrate generally, by way of example, but not by way of limitation, various embodiments discussed in the present document.

DETAILED DESCRIPTION

Figure 1:
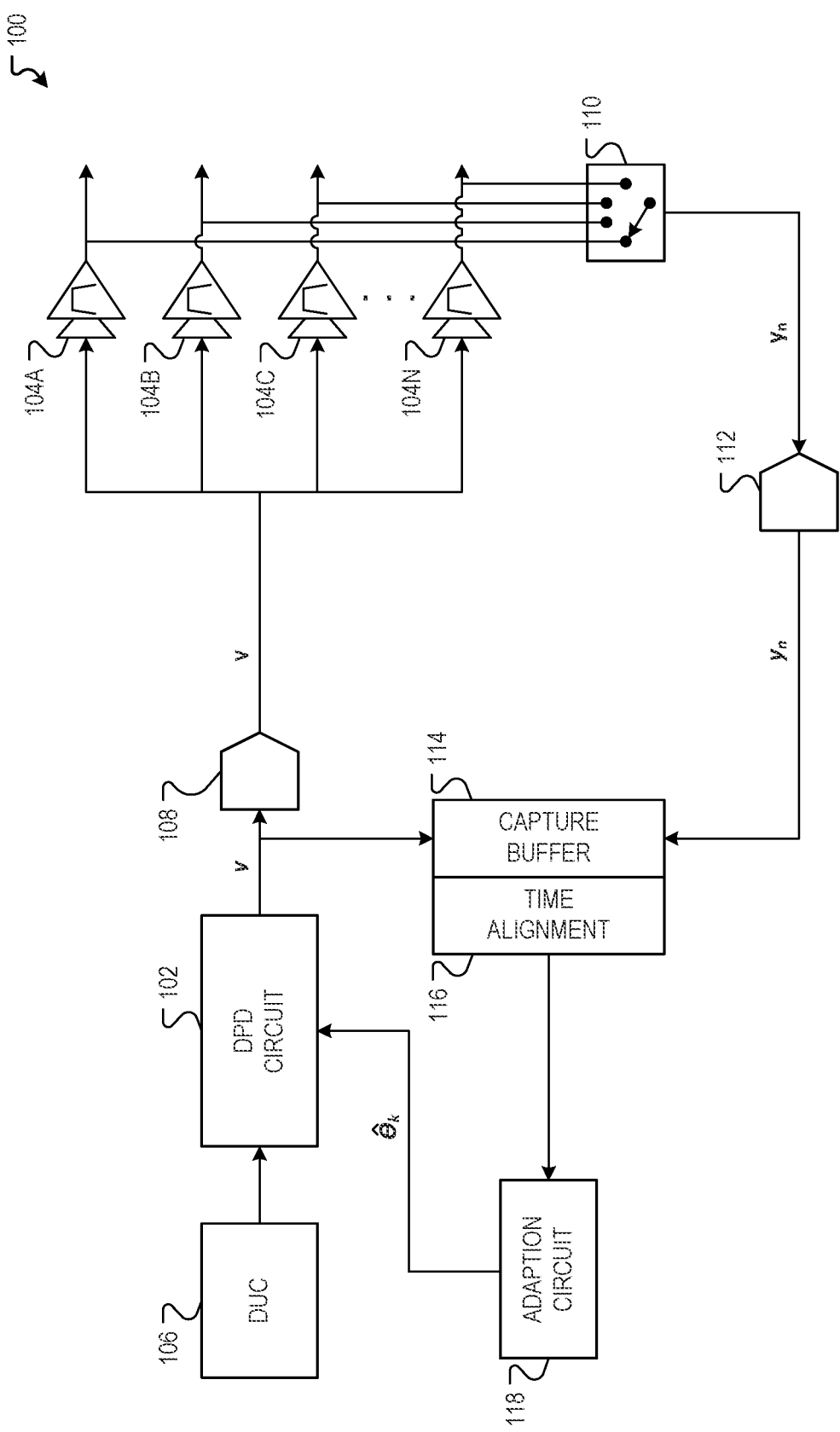
FIG. 1 is a diagram showing one example of an environment for implementing multi-component digital predistortion.

Various examples described herein are directed to systems and methods implementing multi-component DPD where one DPD generates a pre-distorted signal that is provided to multiple PAs. For example, there are many contexts in which it is desirable to provide the same input signal to multiple PAs. One example is in cable television and related cable communications where the same input signal (e.g., representing different television channel signals or other signals) may be transmitted to different customers across different coaxial and/or fiber trunk lines. Another example is in mobile telephony. Some mobile telephony technologies, such as $5^{th}$ Generation (5G) wireless systems, utilize electromagnetic beamforming that involves transmitting the same input signal from different antennas at different power levels and phases.

Because different PAs have different nonlinearities, a DPD trained for the transfer characteristic of one PA may not produce acceptable results when used with another PA (e.g., another PA having different nonlinearities). Accordingly, in a situation where multiple PAs receive a common input signal, it may be desirable to have a dedicated, trained DPD for each PA. Such an arrangement, however, may be expensive to build and resource-intensive to train.

The examples described herein address this and other problems by providing an adaption arrangement for a single DPD circuit that trains the DPD circuit to provide a pre-distorted signal that is suitable for use with multiple PAs. The multiple PAs may be arranged in parallel, with each PA receiving the pre-distorted signal generated by the DPD circuit.

An adaption circuit generates predistortion parameters for the DPD circuit to configure the DPD circuit to generate the pre-distorted signal for the multiple PAs. The adaption circuit receives the pre-distorted signal from the DPD circuit and feedback signals from the multiple PAs. From the pre-distorted signal and the feedback signals, the adaption circuit generates predistortion correlation data based on basis matrices and error vectors generated using the various feedback signals from the PAs.

The adaption circuit may sequentially sample feedback signals of the PAs. For each PA, the adaption circuit generates a basis matrix Y and error vector $\epsilon_{gmpn}$. For example, a first basis matrix $Y_1$ and first error vector $\epsilon_{gmp1}$ are generated from a first feedback signal from a first PA and a corresponding portion of the pre-distorted signal. The first basis matrix $Y_1$ and first error vector $\epsilon_{gmp1}$ are used to generate and/or update predistortion correlation data. A second basis matrix $Y_2$ and second error vector $\epsilon_{gmp2}$ are generated using a second feedback signal from the second PA. The second basis matrix $Y_2$ and the second error vector $C_{gmp2}$ are then used to update the predistortion correlation data. The predistortion correlation data may be updated in this manner, for example, until all PAs have been sampled and used to make a corresponding update to the predistortion correlation data. The adaption circuit may use the updated predistortion correlation data to generate predistortion parameters $\hat{\theta}_k$ for the DPD circuit. The DPD circuit utilizes the predistortion parameters $\hat{\theta}_k$ to generate the pre-distorted signal that is provided to the multiple PAs.

FIG. 1 is a diagram showing one example of an environment 100 for implementing multi-component digital predistortion. The environment 100 includes a DPD circuit 102 and a plurality of power amplifiers 104A, 104B, 104C, 104N, Although four power amplifiers 104A, 104B, 104C, 104N are shown, the environment 100 may include any suitable number of power amplifiers, for example, any suitable number greater than one. According to the environment 100, the DPD circuit 102 generates a pre-distorted signal v. The pre-distorted signal v is provided to a digital-to-analog converter (DAC) 108. The DAC 108 generates an analog pre-distorted signal v. The analog pre-distorted signal v is provided to the PAs 104A, 104B, 1040, 104N, which generate respective output signals, for example, for wired or wireless transmission. FIG. 1 also shows an optional digital upconverter (DUC) 106. The DUC 106 receives one or more baseband input signals, and up-converts them to an IF or RF carrier frequency. The DUC 106 provides an upconverted input signal to the DPD circuit 102. In examples where the DUC 106 is present, the input signal provided to the DPD circuit 102 may be the up-converted input signal generated by the DUC 106.

In the example of FIG. 1, the outputs of the respective PAs 104A, 104B, 104C, 104N are provided to a feedback switching circuit 110 that selectively provides feedback signals $y_n$ from the various PAs 104A, 104B, 104C, 104N to a feedback analog-to-digital converter (ADC) 112. For example, the feedback switching circuit 110 may have a first position forming a first signal path in which a feedback signal $y_1$ of the power amplifier 104A is provided to the feedback ADC 112, a second position forming a second signal path in which a feedback signal $y_2$ of the power amplifier 104B is provided to the feedback ADC 112, a third position forming a third signal path in which a feedback signal $y_3$ of the power amplifier 104C is provided to the feedback ADC 112, and so on The feedback ADC 112 provides a digital feedback signal $y_n$ to a capture buffer 114. The digital feedback signal $y_n$ is a digital version of the feedback signal $y_n$ provided to the feedback ADC 112 by the feedback switching circuit 110. It will be appreciated that other feedback circuitry arrangements may be used. For example, although one feedback ADC 112 is shown in FIG. 1, some examples may use more than one feedback ADC 112.

The capture buffer 114 may also receive the digital pre-distorted signal v from the output of the DPD circuit 102. Although one capture buffer 114 is shown, in some examples, separate capture buffers may be included with one buffer to receive the feedback signal $y_n$ and another buffer to capture the pre-distorted signal v. A time alignment circuit 116 is configured to match or time align values of the feedback signal $y_n$ to corresponding values of the pre-distorted signal v. For example, the time alignment circuit 116 may match values of the pre-distorted signal v to values of the feedback signal $y_n$ that were generated therefrom. Sets of time-aligned values of the pre-distorted signal v and the feedback signal $y_n$ are provided to the adaption circuit 118.

The adaption circuit 118 generates predistortion parameters $\hat{\theta}_k$ for the DPD circuit 102 from the feedback signal $y_n$ and pre-distorted signal v. In some examples, the predistortion parameters $\hat{\theta}_k$ include a set of coefficients that may be used by the DPD circuit 102 to implement a polynomial approximation of the inverse model of the PAs 104A, 104B, 104C, 104N. For example, the coefficients may be used as coefficients for taps of a digital filter that implements all or part of the DPD circuit 102. Also, in some examples, the predistortion parameters $\hat{\theta}_k$ include a lookup table (LUT) that is applied by the DPD circuit 102 to generate the pre-distorted signal v.

Figure 2:
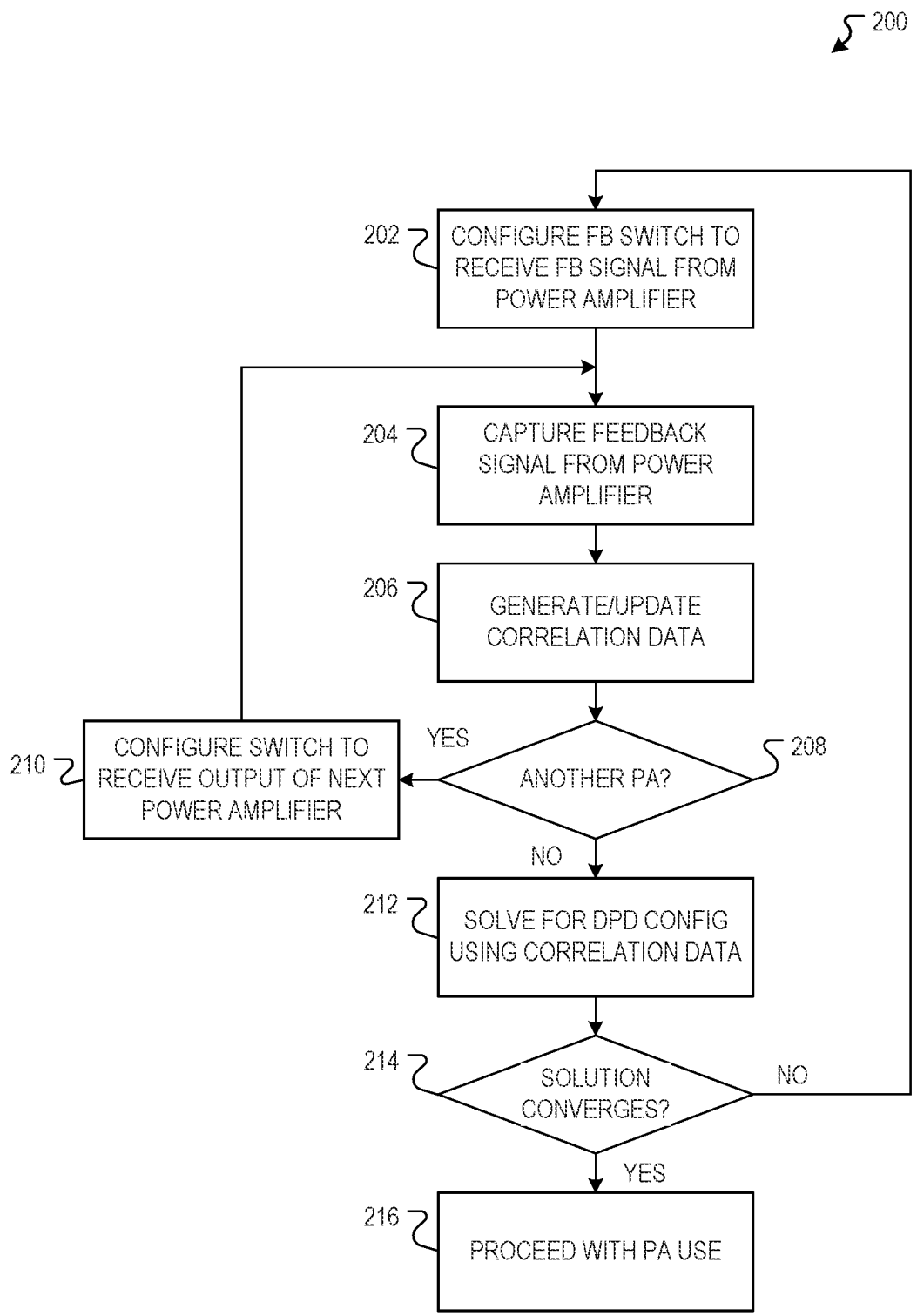
FIG. 2 is a flowchart showing one example of a process flow that may be executed in the environment to train the DPD circuit.

FIG. 2 is a flowchart showing one example of a process flow 200 that may be executed in the environment 100 to train the DPD circuit 102. At operation 202, the feedback switching circuit is configured to provide a feedback signal from a first power amplifier 104A, 104B, 1040, 104N to the capture buffer 114 (e.g., via the feedback ADC 112). This description will assume that the feedback signal $y_1$ from the PA 104A is provided first, however, any suitable PA 104A, 104B, 104C, 104N may be selected first. At operation 204, the capture buffer 114 captures values of the feedback signal $y_1$ and corresponding values of the pre-distorted signal v. The feedback signal $y_1$ may be taken at the output of the DPD circuit 102 as shown in FIG. 1 or in, some examples, may be taken from the input of the DPD circuit 102 in a direct adaption arrangement.

At operation 206, the adaption circuit 118 generates and/or updates predistortion correlation data. For example, the adaption circuit 118 may utilize feedback signal $y_1$ and the corresponding values of the pre-distorted signal v to generate a basis matrix $Y_1$ and an error vector $\epsilon_{gmp1}$. The basis matrix $Y_1$ describes features of the DPD circuit 102 chosen to reflect the dynamic composition of the inverse PA behavior, such as; past and present linear terms and past and present nonlinear terms. The error vector $\epsilon_{gmp1}$ is an indication of the error between the estimated inverse PA response and the actual DPD output v. and the corresponding values of the pre-distorted signal v.

The adaption circuit 118 uses the basis matrix $Y_1$ and an error vector $\epsilon_{gmp1}$ to generate predistortion correlation data. The predistortion correlation data may include an autocorrelation matrix $R_{yy}$, and a cross-correlation vector $r_{y\epsilon}$. The autocorrelation matrix $R_{yy}$ indicates a correlation between the various features of the basis matrix $Y_1$. In some examples, the autocorrelation vector $R_{yy}$ is given by Equation [1] below:

$$R_{yy} = R_{yy} + Y^H Y \quad [1]$$

In Equation [1], an inner product is taken between the autocorrelation matrix (in this example $Y_1$) and the Hermitian transpose of the autocorrelation matrix (indicated by the operator "$^H$"). The result of the inner product is added to a previous iteration of the autocorrelation matrix $R_{yy}$. When the operation 206 is executed for the first time, the previous version of the autocorrelation matrix $R_{yy}$ may be set to the null matrix (e.g., a matrix of zeros). In some examples, the autocorrelation matrix is a square matrix having an order based on the number of features in the basis matrix Y. For example, if the basis matrix Y has twenty features, then the autocorrelation matrix $R_{yy}$ may be a 20×20 matrix.

The cross-correlation vector $r_{y\epsilon}$ indicates a correlation between the basis matrix Y and the error vector $\epsilon_{gmp}$. In some examples, the cross-correlation vector $r_{y\epsilon}$ is given by Equation [2] below:

$$r_{y\epsilon} = r_{y\epsilon} + Y^H \epsilon \quad [2]$$

According to Equation [2], an inner product is taken between the Hermitian transpose of the basis matrix Y and the error vector $\epsilon_{gmp}$. The result is added to a previous iteration of the cross-correlation vector $r_{y\epsilon}$. When the operation 206 is executed for the first time, the previous iteration of the cross-correlation vector $r_{y\epsilon}$ may be set to the null vector. The result of the operation 206 may be generated and/or updated predistortion correlation data including, for example, a value for the autocorrelation matrix $R_{yy}$ and a value for the cross-correlation vector or $r_{y\epsilon}$.

At operation 208, it is determined whether there are any additional PAs 104A, 104B, 104C, 104N to be sampled. For example, it may be determined if any PAs 104A, 104B, 104C, 104N have not yet been sampled for the current execution of the process flow 200. If there are any additional PAs 104A, 104B, 104C, 104N to be sampled, the feedback switching circuit 110 is configured to provide a feedback signal from a next power amplifier 104A, 104B, 104C, 104N to the capture buffer 114 (e.g., via the feedback ADC 112). At operation 204, the capture buffer 114 captures values of the feedback signal $y_n$ from the next PA 104A, 104B, 104C, 104N and corresponding values of the pre-distorted signal v.

Returning to operation 206, the adaption circuit 118 generates updated predistortion correlation data. For example, the adaption circuit 118 may utilize Equations [1] and [2] above to generate an updated autocorrelation matrix $R_{yy}$ and an updated cross-correlation vector $r_{y\epsilon}$, where the previous versions of $R_{yy}$ and $r_{y\epsilon}$ are as determined the previous time that the operation 206 was executed.

If at operation 208 it is determined that all PAs 104A, 104B, 104C, 104N have been sampled at operation 204 and corresponding updates to the predistortion correlation data made at operation 206, then operation 212 may follow. At operation 212, the adaption circuit 118 utilizes a linear solver to generate predistortion parameters $\hat{\theta}_k$ for the DPD circuit 102 using the updated predistortion correlation data. Equation [3] below provides an example that may be implemented by the adaption circuit 118 to generate the predistortion parameters $\hat{\theta}_k$:

$$\hat{\theta}_k = \hat{\theta}_{k-1} + \mu \{R_{yy} + \lambda I\}^{-1} r_{y\epsilon} \quad [3]$$

In Equation [3], $\hat{\theta}_{k-1}$ is the previous iteration of the predistortion parameters. The value $\mu$ is a real scaler that may be chosen to trade off noise immunity against the adaption rate (e.g., the rate at which the DPD circuit 102 is updated). The term $\lambda$ is a scaler that is a regularization factor that may be chosen to improve the numerical conditioning of the calculations and minimize over fitting. I is the identity matrix of appropriate dimension.

At operation 214, the adaption circuit 118 determines whether the solution attempted at operation 212 has converged. If there is no convergence, the adaption circuit 118 may return to operation 204 to re-sample the PAs 104A, 104B, 104C, 104N before re-attempting to solve for the predistortion parameters $\hat{\theta}_k$. If the solution does converge, then the predistortion parameters $\hat{\theta}_k$ are provided to the DPD circuit and the environment proceeds with use of the PAs 104A, 104B, 104C, 104N at operation 216.

In some examples, the techniques described herein can be applied to arrangements where the transmission medium exhibits frequency-dependent attenuation. One example of such a medium is coaxial cable. Cable exhibits a high-frequency roll-off characteristic in which higher frequencies are attenuated at higher levels than lower frequencies. In some examples, cables exhibit about 2 dB of signal amplitude reduction per 100 MHz of frequency, such as at frequencies above 50 MHz. To compensate for this, a tilt filter is added, for example, after a digital-to-analog converter (DAC). The tilt filter applies an "uptilt" frequency characteristic to the pre-distorted signal. The tilt frequency characteristic amplifies higher frequency portions of the signal that are attenuated by the cable so as to reduce frequency-dependent distortions at the signal destination. In some examples, the tilt frequency characteristic increases in gain by frequency according to a tilt slope, with the signal amplitude increasing as frequency increases.

When a tilt filter is used, for example, in a cable implementation, the DPD circuit may also include a tilt reference filter and a tilt equalizer circuit. The tilt reference filter (positioned to operate on the input signal prior to predistortion) and the tilt equalizer circuit (positioned to operate on the pre-distorted signal) place a tilt characteristic onto the pre-distorted signal, for example, prior to the tilt filter. The tilt characteristic attenuates higher frequency portions of the signal. In some examples, the inverse tilt characteristic decreases in gain by frequency according to a tilt slope, which may be the inverse of the tilt slope up the tilt filter.

Figure 3:
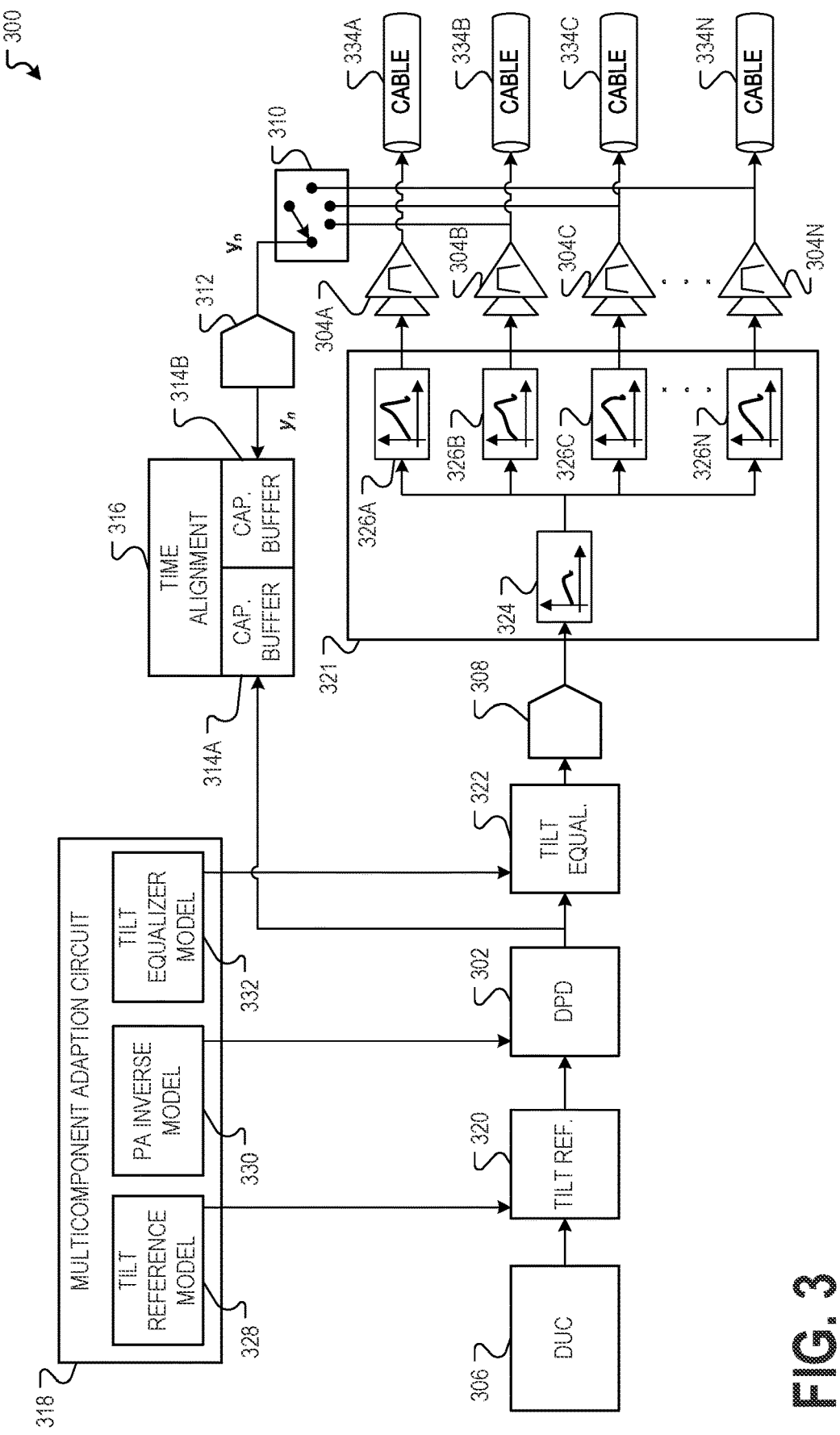
FIG. 3 is a diagram showing one example of an environment including a DPD circuit for driving multiple PAs for transmitting over cable media.

The example illustrated by FIGS. 1 and 2 shows an indirect learning algorithm where the training error $\epsilon_{gmp}$ is the difference between the actual output of the DPD circuit 102 and the inverse model of the PAs 104A, 104B, 104C, 104N. In other examples arrangement a direct approach is used where the training error $\epsilon_{gmp}$ is the difference between the input to the DPD circuit 102 and the observed output. In various examples, a direct or indirect learning algorithm may be used with the other examples described herein, as appropriate. FIG. 3 is a diagram showing one example of an environment 300 including a DPD circuit 302 for driving multiple PAs 304A, 304B, 304C 304N for transmitting over cable media 334A, 334B, 334C, 334N. In the environment 300, a tilt filter circuit 321 applies tilt filter characteristics to the respective PAs 304A, 304B, 304C, 304N. In the example of FIG. 3, a first stage tilt filter 324 provides a first stage tilt filter characteristic common to all of the PAs 304A, 304B, 304C, 304N. Second stage tilt filters 326A, 326B, 326C, 326N receive the output of the first stage tilt filter 324 and apply second stage tilt filter characteristics that are, for example, selected to correspond to the frequency-dependent attenuation characteristics of the respective cable media 334A, 334B, 334C, 334N. Different arrangements can be used. In some examples, the first stage tilt filter 324 is omitted. In other examples, additional stages may be used. The tilt filter circuit 321, in some examples, is implemented utilizing analog components to achieve the desired characteristic.

In the example of FIG. 3, the environment 300 also includes a tilt reference filter circuit 320 and tilt equalizer circuit 322. The tilt reference filter circuit 320 and tilt equalizer circuit 322 place a tilt characteristic onto the pre-distorted signal v to compensate for the effect of the tilt filter circuit 321. For example, the tilt filter circuit 321 imposes a linear distortion to the signal provided to the respective PAs 304A, 304B, 304C, 304N. The tilt reference filter circuit 320, positioned between the optional DUC 306 and the DPD circuit 302 corrects for this linear distortion, for example, by attempting to replicate it in the digital domain. The tilt equalizer circuit 322, positioned between the DPD circuit 302 and the DAC 308, may be the inverse of the tilt reference filter circuit 320. In some examples, the tilt reference filter 320 and tilt equalizer circuit 322 are implemented using one or more digital signal processors (DSPs) or other suitable hardware arrangement, such as the architecture 1100 described herein below.

As with the DPD circuit 302 itself, it is desirable in some examples to train the tilt reference filter circuit 320 and tilt equalizer circuit 322 to match the nonlinearities of the respective output processing paths to the respective PAs 304A, 304B, 304C, 304N. Accordingly, training the tilt reference filter circuit 320 and tilt equalizer circuit 322 to operate with multiple output processing paths can present issues similar to those encountered when training the DPD circuit 302 to operate with multiple PAs 304A, 304B, 304C, 304N.

The example arrangement of FIG. 3 shows an example way to address the training of the tilt reference filter circuit 320 and tilt equalizer circuit 322 for use with multiple output processing paths to multiple PAs 304A, 304B, 304C, 304N. For example, a feedback switching circuit 310 is configured to selectively sample feedback signals $y_n$ from the PAs 304A, 304B, 304C, 304N. A feedback ADC 312, capture buffers 314A, 314B and time alignment circuit 316 may work in a manner similar to feedback ADC 112, capture buffer 114, and time alignment circuit 116 to provide time-aligned signals to an adaption circuit 318. The adaptation circuit 318 may comprise a PA inverse model 330 for generating predistortion parameters $\hat{\theta}_k$, a tilt equalizer model 332 for generating tilt equalizer parameters $\hat{\theta}_{equk}$ for the tilt equalizer circuit 322 and a tilt reference model 328 for generating tilt reference parameters. In some examples, the adaption circuit 318 is implemented using a processor arrangement, for example, similar to the architecture 1100 described herein below. Time alignment circuit 316 and buffer circuits 314A, 314B may also be implemented using all or a portion of an arrangement similar to the architecture 1100. In some examples, the time alignment 316 and buffer circuits 314A, 314B can be implemented utilizing one or more shift registers or other suitable components.

Figure 4:
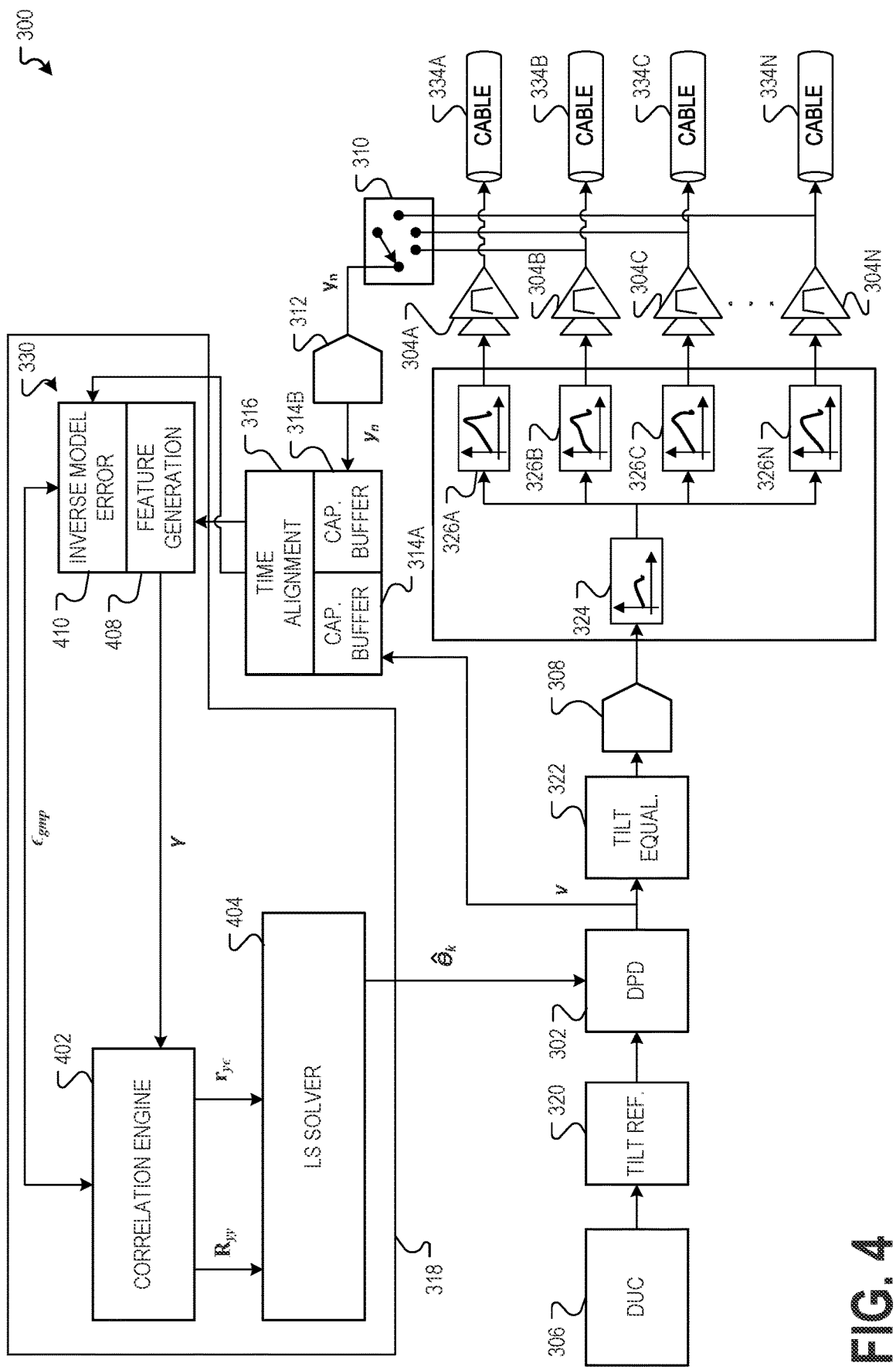
FIG. 4 is a diagram showing one example of the environment of FIG. 3 configured to generate predistortion parameters.

FIG. 4 is a diagram showing one example of the environment 300 of FIG. 3 configured to generate predistortion parameters $\hat{\theta}_k$. The example arrangement of FIG. 4 shows the PA inverse model 330 including a feature generation circuit 408 to generate basis matrix Y and an inverse model error circuit 410 to generate error vector $\epsilon_{gmp}$, for example, as described herein. In the arrangement shown in FIG. 4, the DPD circuit 302 may be trained according to the process flow 200 described herein. For example, the feature generation circuit 408 may generate basis matrix Y based on the respective feedback signals from the PAs 304A, 304B, 3040, 304N and the pre-distorted signal v. The inverse model error circuit 410 may generate error vectors $\epsilon_{gmp}$ based on the estimated inverse model of the measured output of each of the PAs 304A, 304B, 304C, 304N and the pre-distorted signal v. The correlation engine 402 may generate correlation data, for example, according to Equations [1] and [2] above. A linear solver circuit 404 may be configured to generate the predistortion parameters $\hat{\theta}_k$, for example, according to Equation [3] described above.

Figure 5:
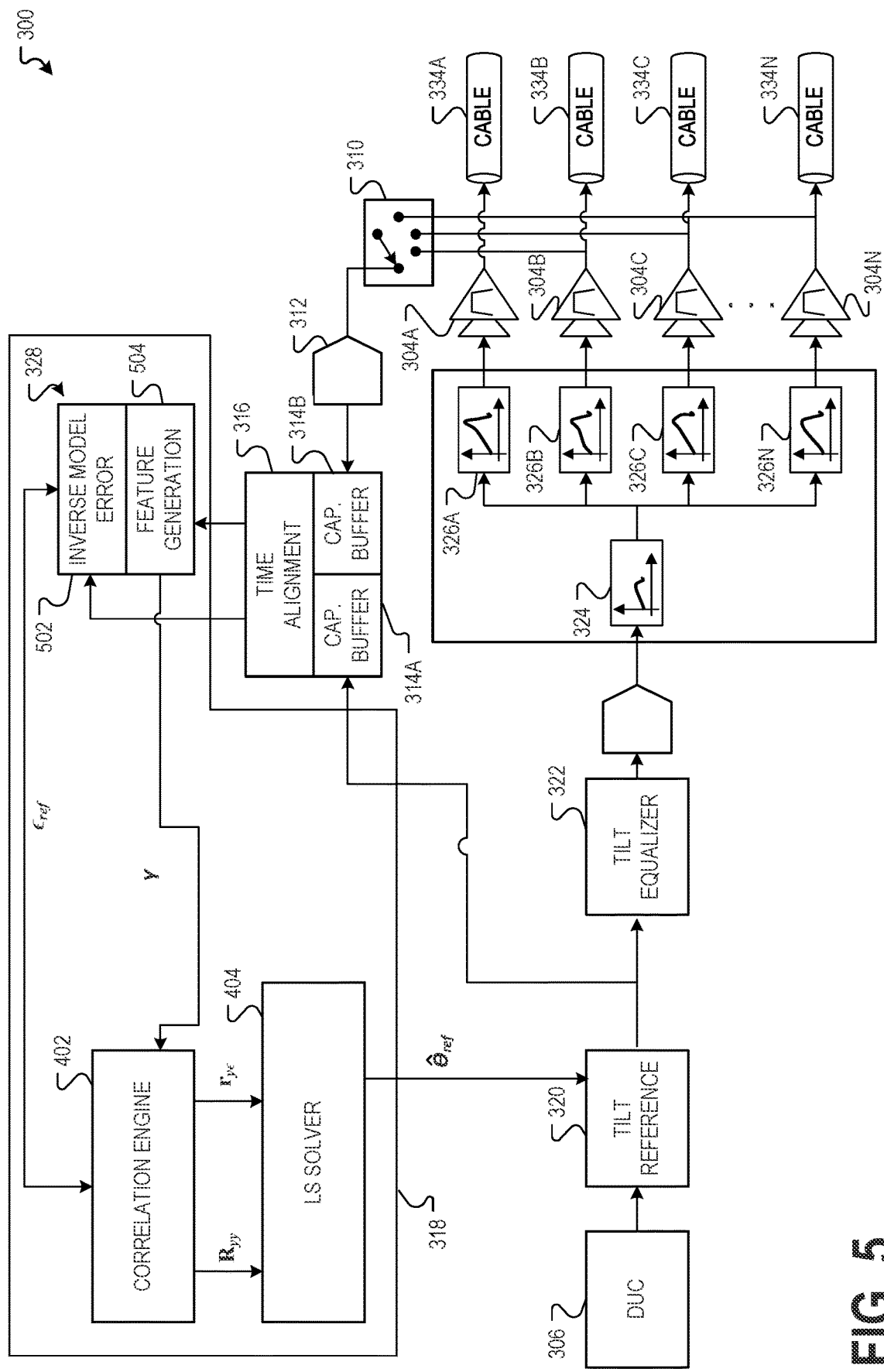
FIG. 5 is a diagram showing one example of the environment of FIG. 3 configured to generate tilt reference parameters for the tilt reference circuit.
Figure 6:
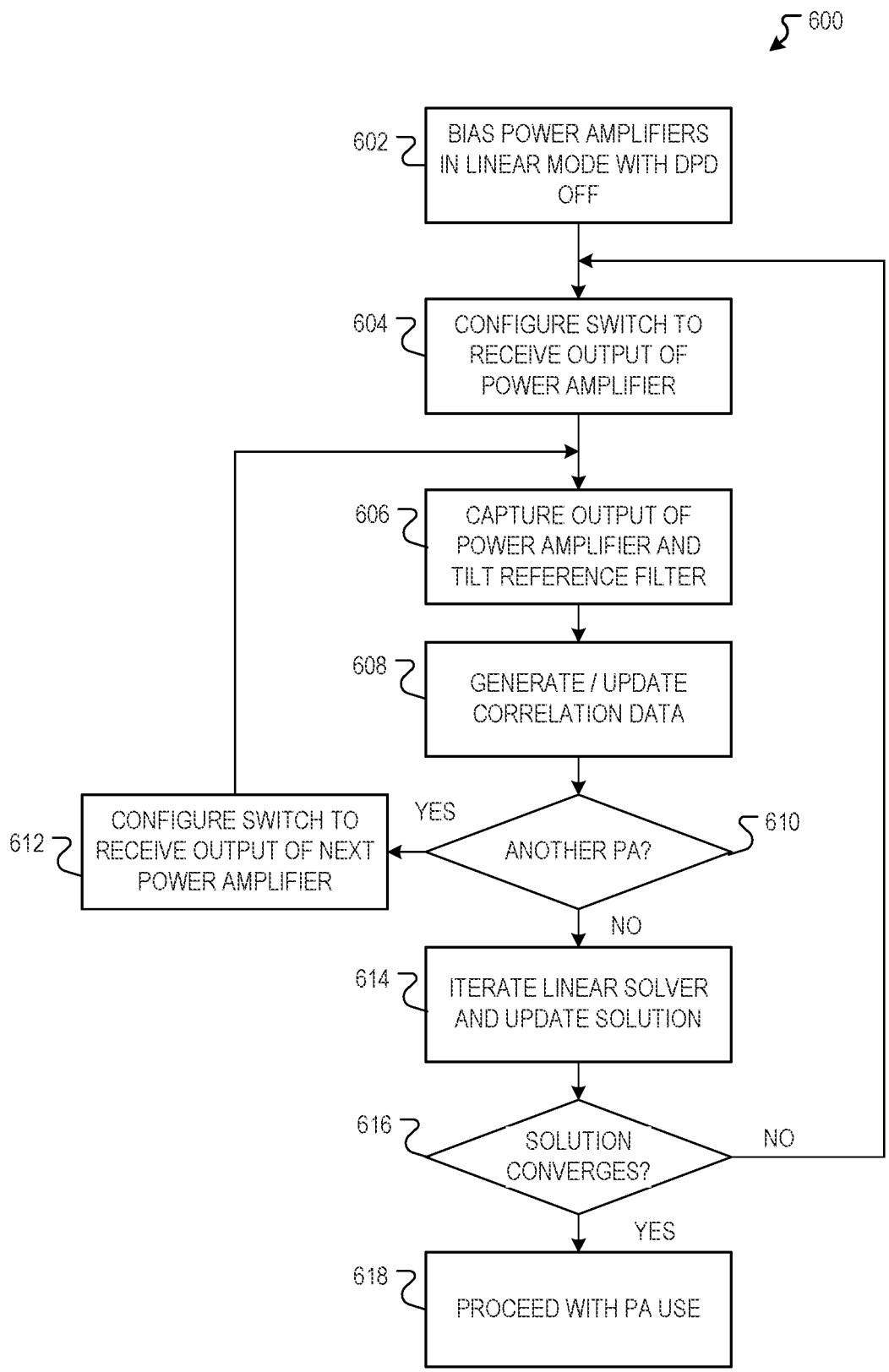
FIG. 6 is a flowchart showing one example of a process flow that may be executed in the environment, for example, in the arrangement shown in FIG. 5, to generate tilt reference parameters reference parameters.

FIG. 5 is a diagram showing one example of the environment 300 of FIG. 3 configured to generate tilt reference parameters $\hat{\theta}_{ref}$ for the tilt reference filter circuit 320. The example arrangement of FIG. 5 shows the tilt reference model 328 including a feature generation circuit 504 to generate basis matrix Y and an inverse model error circuit 502 to generate error vectors $\epsilon_{ref}$. FIG. 6 is a flowchart showing one example of a process flow 600 that may be executed in the environment, for example, in the arrangement shown in FIG. 5, to generate tilt reference parameters reference parameters $\hat{\theta}_{ref}$.

At operation 602, the PAs 304A, 304B, 304C, 304N are biased in a linear mode with the DPD circuit 302 turned off. Biasing the PAs 304A, 304B, 304C, 304N in linear mode may include biasing the PAs 304A, 304B, 304C, 304N such that nonlinearities of the PAs 304A, 304B, 304C, 304N do not affect or minimally affect the outputs of the PAs 304A, 304B, 304C, 304N. Turning off the DPD circuit 302 may include, for example, bypassing the DPD circuit 302, removing power to the DPD circuit 302 and/or otherwise removing it from the circuit. This is illustrated in FIG. 5 by the absence of the DPD circuit 302. As shown, the output of the tilt reference filter circuit 320 is provided directly to the tilt equalizer circuit 322.

At operation 604, the feedback switching circuit 310 is configured to provide a feedback signal $y_1$ from a first power amplifier 304A, 304B, 3040, 304N to the capture buffer 314B (e.g., via the feedback ADC 312). This description will assume that the feedback signal $y_1$ from the PA 304A is provided first, however, as described herein any suitable PA 304A, 304B, 304C, 304N may be selected first. At operation 606, the capture buffers 314A, 314B capture values of the feedback signal $y_1$ and corresponding values of the tilt reference filter circuit 320. For example, values of the feedback signal $y_1$ may be captured at the capture buffer 314B and values of the output of the tilt reference filter circuit 320 may be captured at the capture butler 314A. In some examples, the adaption circuit 318 can be arranged to perform indirect adaption for the tilt reference filter circuit 320. For example, the adaption circuit 318 may be configured to capture feedback from an input to the tilt reference filter 320 (e.g., instead of or in addition to capturing feedback from the output as shown in FIG. 5).

At operation 608, the adaption circuit 318 generates and/or updates tilt reference correlation data. For example, the adaption circuit 318 may utilize the feedback signal $y_1$ and the corresponding values of the output of the tilt reference filter circuit 320 to generate a basis matrix $Y_1$ and an error vector $\epsilon_{ref1}$. The basis matrix $Y_1$ describes features of the DPD circuit 102 to minimize the error between the feedback signal $y_1$ and the corresponding values of the tilt reference filter circuit 320 output. The error vector $\epsilon_{ref1}$ is an indication of the error between the feedback signal $y_1$ and the corresponding values of the output of the tilt reference filter circuit 320.

The adaption circuit 318 uses the basis matrix $Y_1$ and an error vector $\epsilon_{ref1}$ to generate tilt reference correlation data. The tilt reference correlation data can be generated, for example, by the correlation engine 402. The tilt reference correlation data may include an autocorrelation matrix $R_{yy}$ and a cross-correlation vector $r_{y\epsilon}$. The autocorrelation matrix $R_{yy}$ indicates a correlation between the various features of the basis matrix $Y_1$. In some examples, the autocorrelation vector $R_{yy}$ is given by Equation [1] above. The cross-correlation vector $r_{y\epsilon}$ indicates a correlation between the basis matrix Y and the error vector $\epsilon_{ref}$, for example, as given by Equation [2] above.

At operation 610, it is determined whether there are any additional PAs 304A, 304B, 304C, 304N to be sampled. For example, it may be determined if any PAs 304A, 304B, 304C, 304N have not yet been sampled for the current execution of the process flow 600. If there are any additional PAs 304A, 304B, 304C, 304N to be sampled, the feedback switching circuit 310 is configured at operation 612 to provide a feedback signal from a next power amplifier 304A, 304B, 304C, 304N to the capture buffer 314B (e.g., via the feedback ADC 312). At operation 606, the capture buffer 314B captures values of the feedback signal $y_n$ from the next PA 304A, 304B, 304C, 304N and corresponding values of the output of the tilt reference filter circuit 320.

Returning to operation 608, the adaption circuit 318 generates updated tilt reference correlation data. For example, the adaption circuit 318 may utilize Equations [1] and [4] above to generate an updated autocorrelation matrix $R_{yy}$ and an updated cross-correlation vector $r_{y\epsilon}$, where the previous versions of $R_{yy}$ and $r_{y\epsilon}$ are as determined the previous time that the operation 608 was executed.

If, at operation 610 it is determined that all PAs 304A, 304B 304C, 304N have been sampled at operation 606 and corresponding updates to the tilt reference correlation data made at operation 608, then operation 614 may follow. At operation 614, the adaption circuit 318 utilizes the linear solver 404 to generate tilt reference parameters $\hat{\theta}_{ref}$ for the tilt reference filter circuit 320 using the updated tilt reference correlation data, for example, by optimizing Equation [4] below provides an example that may be implemented by the adaption circuit 318 to generate the tilt reference parameters $\hat{\theta}_{ref}$:

$$\hat{\theta}_{ref} = \hat{\theta}_{ref-1} + \mu \{R_{yy} + \lambda I\}^{-1} r_{y\epsilon} \qquad [4]$$

In Equation [5], $\hat{\theta}_{ref-1}$ is the previous iteration of the tilt reference parameters. The values μ and λ may be as described with respect to Equation [3] above.

At operation 616, the adaption circuit 318 determines whether the solution attempted at operation 614 has converged. If there is no convergence, the adaption circuit 318 may return to operation 604 to re-sample the PAs 304A, 304B, 304C, 304N before re-attempting to solve for the tilt reference parameters $\hat{\theta}_{ref}$. If the solution does converge, then the tilt reference parameters $\hat{\theta}_{ref}$ are provided to the tilt reference filter circuit 320. The DPD circuit 302 may be re-activated and the environment may proceed with use of the PAs 304A, 304B, 304C, 304N at operation 618.

Figure 7:
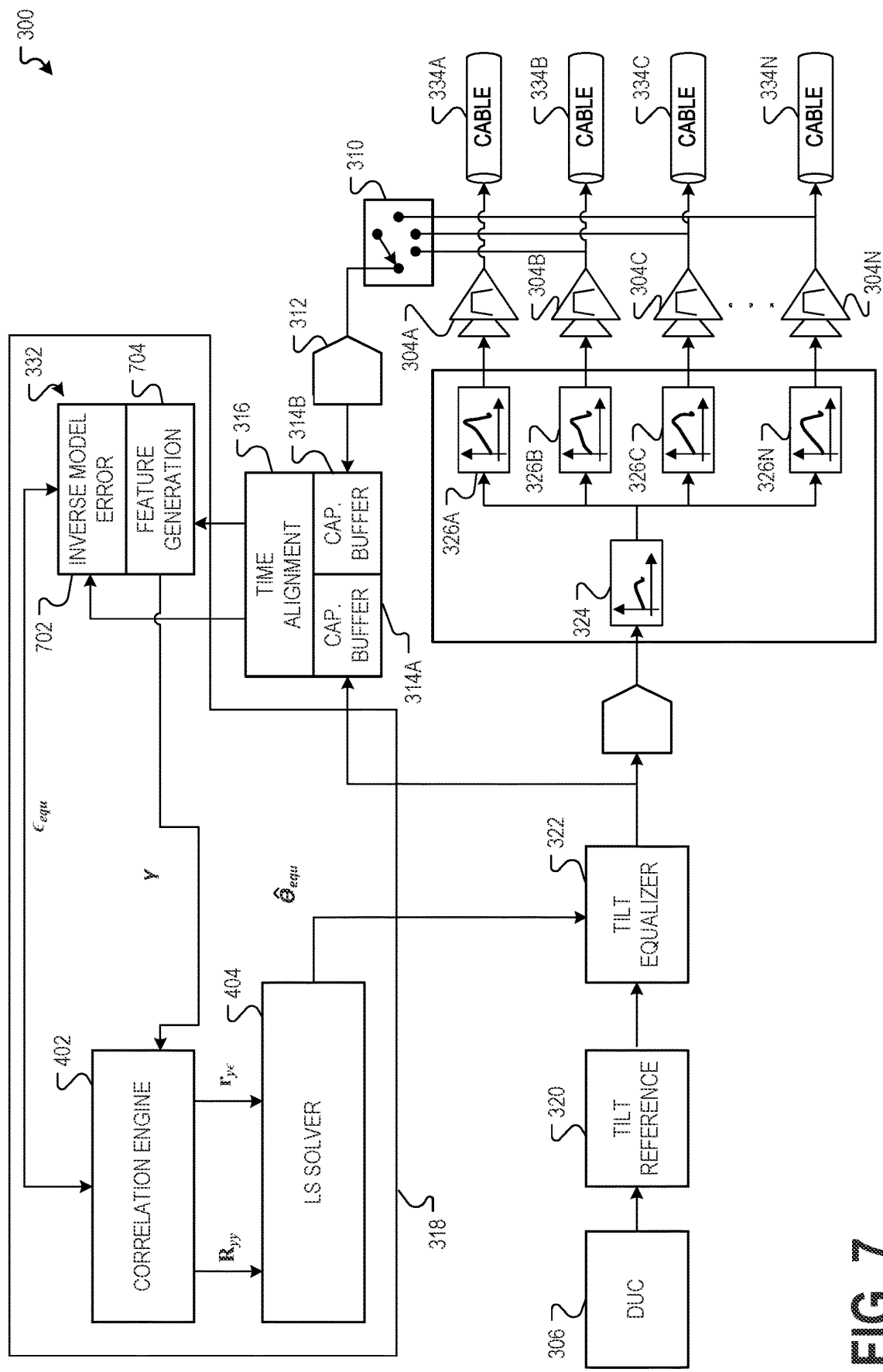
FIG. 7 is a diagram showing one example of the environment of FIG. 3 configured to generate tilt equalizer parameters for the tilt equalizer circuit.
Figure 8:
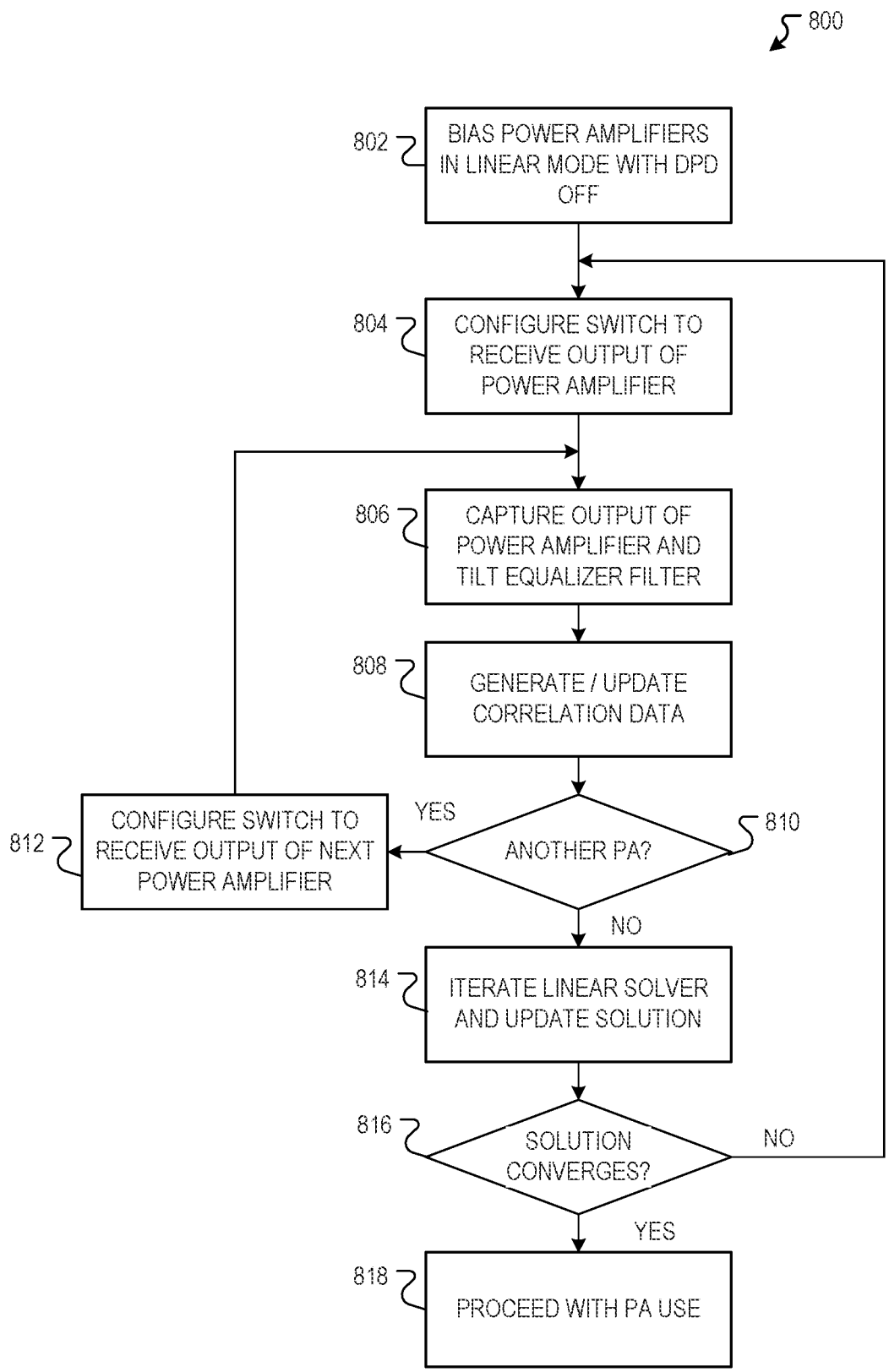
FIG. 8 is a flowchart showing one example of a process flow that may be executed in the environment, for example, in the arrangement shown in FIG. 7, to generate tilt equalizer parameters equalizer parameters.

FIG. 7 is a diagram showing one example of the environment 300 of FIG. 3 configured to generate tilt equalizer parameters $\hat{\theta}_{equ}$ for the tilt equalizer circuit 322. The example arrangement of FIG. 7 shows the tilt equalizer model 332 including a feature generation circuit 704 to generate a basis matrix Y and an inverse model error circuit 702 to generate error vectors $\epsilon_{equ}$. FIG. 8 is a flowchart showing one example of a process flow 800 that may be executed in the environment, for example, in the arrangement shown in FIG. 7, to generate tilt equalizer parameters, $\hat{\theta}_{equ}$.

At operation 802, the PAs 304A, 304B, 304C, 304N are biased in a linear mode with the DPD circuit 302 turned off At operation 804, the feedback switching circuit 310 is configured to provide a feedback signal $y_1$ from a first power amplifier 304A, 304B, 304C, 304N to the capture buffer 314B (e.g., via the feedback ADC 312). This description will assume that the feedback signal $y_1$ from the PA 304A is provided first; however, as described herein any suitable PA 304A, 304B, 304C, 304N may be selected first. At operation 806, the capture buffers 314A, 314B capture values of the feedback signal $y_1$ and corresponding values of the tilt equalizer circuit 322 input. For example, values of the feedback signal $y_1$ may be captured at the capture buffer 314B and values of the output from the tilt equalizer circuit 322 may be captured at the capture buffer 314A. In some examples, the adaption circuit 318 can be arranged to perform indirect adaption for the tilt equalizer circuit 322. For example, the adaption circuit 318 may be configured to capture feedback from an input to the tilt equalizer circuit 322 (e.g., instead of or in addition to capturing feedback from the output as shown in FIG. 7).

At operation 808, the adaption circuit 318 generates and/or updates tilt equalizer correlation data. For example, the adaption circuit 318 may utilize the feedback signal $y_1$ and the corresponding values of the output of the tilt equalizer circuit 322 to generate a basis matrix $Y_1$ and an error vector $\epsilon_{equ1}$. The basis matrix $Y_1$ describes (linear) features to minimize the error between the feedback signal $y_1$ and the corresponding values of the output of the tilt equalizer circuit 322. The error vector $\epsilon_{equ1}$ is an indication of the error between the feedback signal $y_1$ and the corresponding values of the output of the tilt equalizer circuit 322. In some examples, the basis matrix $Y_1$ for generating the tilt equalizer circuit 322 and tilt reference circuit 320 parameters include linear terms while the basis matrix $Y_1$ for generating DPD circuit 302 parameters may include linear and/or non-linear terms.

The adaption circuit 318 uses the basis matrix $Y_1$ and an error vector $\epsilon_{equ1}$ to generate tilt equalizer correlation data. The tilt equalizer correlation data can be generated, for example, by the correlation engine 402. The tilt equalizer correlation data may include an autocorrelation matrix $R_{yy}$ and a cross-correlation vector $r_{y\epsilon}$, as described herein. The autocorrelation matrix $R_{yy}$ indicates a correlation between the various features of the basis matrix $Y_1$. In some examples, the autocorrelation vector $R_{yy}$ is given by Equation [1] above. The cross-correlation vector $r_{y\epsilon}$ indicates a correlation between the basis matrix Y and the error vector $\epsilon_{equ}$. In some examples, the cross-correlation vector $r_{y\epsilon}$ is given by Equation [2] above.

At operation 810, it is determined whether there are any additional PAs 304A, 304B, 304C, 304N to be sampled. For example, it may be determined if any PAs 304A, 304B, 304C, 304N have not yet been sampled for the current execution of the process flow 800. If there are any additional PAs 304A, 304B, 304C, 304N to be sampled, the feedback switching circuit 310 is configured at operation 812 to provide a feedback signal from a next power amplifier 304A, 304B, 304C, 304N to the capture buffer 314B (e.g., via the feedback ADC 312). At operation 806, the capture buffer 314B captures values of the feedback signal $y_n$ from the next PA 304A, 304B, 304C, 304N and corresponding values of the input to the tilt equalizer circuit 322.

Returning to operation 808, the adaption circuit 318 generates updated equalizer correlation data. For example, the adaption circuit 318 may utilize Equations [1] and [4] above to generate an updated autocorrelation matrix $R_{yy}$ and an updated cross-correlation vector $r_{y\epsilon}$, where the previous versions of $R_{yy}$ and $r_{y\epsilon}$ are as determined the previous time that the operation 808 was executed.

If at operation 810 it is determined that all PAs 304A, 304B, 304C, 304N have been sampled at operation 806 and corresponding updates to the tilt equalizer correlation data made at operation 808, then operation 814 may follow. At operation 814, the adaption circuit 318 utilizes the linear solver 404 to generate tilt equalizer parameters $\hat{\theta}_{equ}$ for the tilt equalizer circuit 322 using the updated tilt equalizer correlation data, for example, by optimizing Equation [5] below provides an example that may be implemented by the adaption circuit 318 to generate the tilt equalizer parameters $\hat{\theta}_{equ}$:

$$\hat{\theta}_{equ} = \hat{\theta}_{equ-1} + \mu \{R_{yy} + \lambda I\}^{-1} r_{y\epsilon} \qquad [5]$$

In Equation [5], $\hat{\theta}_{equ-1}$ is the previous iteration of the tilt equalizer parameters. The values μ and λ may be as described with respect to Equation [3] above.

At operation 816, the adaption circuit 318 determines whether the solution attempted at operation 814 has converged. If there is no convergence, the adaption circuit 318 may return to operation 804 to re-sample the PAs 304A, 304B, 304C, 304N before re-attempting to solve for the tilt equalizer parameters $\hat{\theta}_{equ}$. If the solution does converge, then the tilt equalizer parameters $\hat{\theta}_{equ}$ are provided to the tilt equalizer circuit 322. The DPD circuit 302 may be re-activated and the environment may proceed with use of the PAs 304A, 304B, 304C, 304N at operation 818. In some examples, the tilt equalizer circuit 322 and tilt reference filter circuit 320 are trained independently of the DPD circuit 302. For example, the tilt reference filter parameters $\hat{\theta}_{equ}$ and tilt reference parameters $\hat{\theta}_{ref}$ may be determined first, for example, as illustrated and described with respect to FIGS. 5-8. After the tilt reference filter circuit 320 and tilt equalizer circuit 322 are trained, the DPD circuit 302 may be trained, for example, as described herein.

Figure 9:
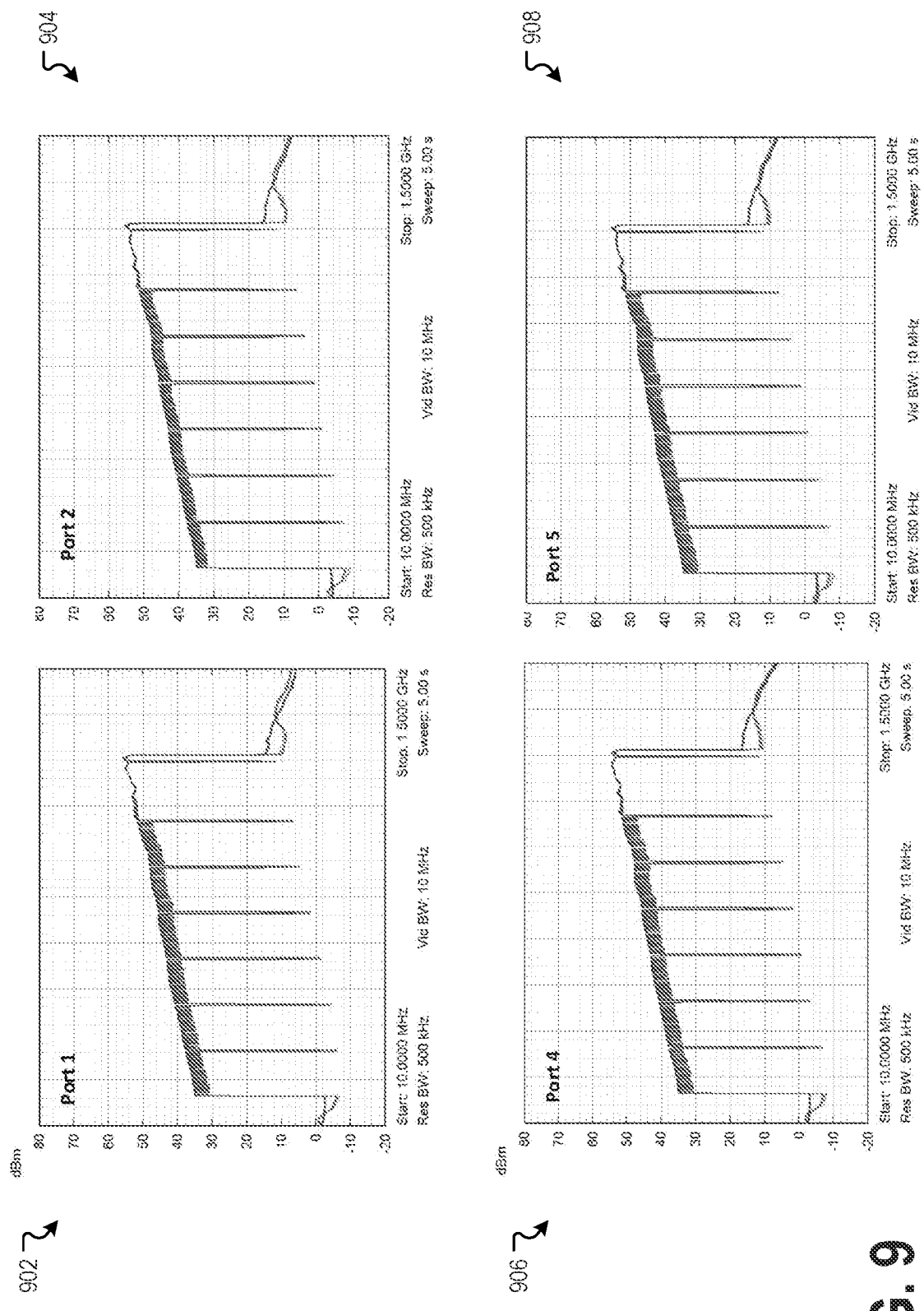
FIG. 9 shows four plots illustrating outputs of four PAs in the arrangement of the PAs with components trained as described with respect to FIGS. 3-8.

FIG. 9 shows four plots 902, 904, 906, 908 illustrating outputs of four PAs in the arrangement of the PAs 304A, 304B, 304C, 304N, with components trained as described with respect to FIGS. 3-8. Plot 902 shows signal strength in decibels (dB) versus frequency for a first PA, such as PA 304A. Plot 904 shows signal strength in dB versus frequency for a second PA, such as PA 304B. Plot 906 shows signal strength in dB versus frequency for a third PA, such as PA 304C. Plot 908 shows signal strength in dB versus frequency for a fourth PA, such as PA 304N. The plots 902, 904, 906, 908 show tilt provided by the tilt circuit 321 as the displayed signals are higher at higher frequency to compensate for the higher attenuation of the cable media 334A, 334B, 334C, 334N at higher frequencies. Also, as shown, the outputs are substantially similar despite being driven by a single DPD circuit 302.

Figure 10:
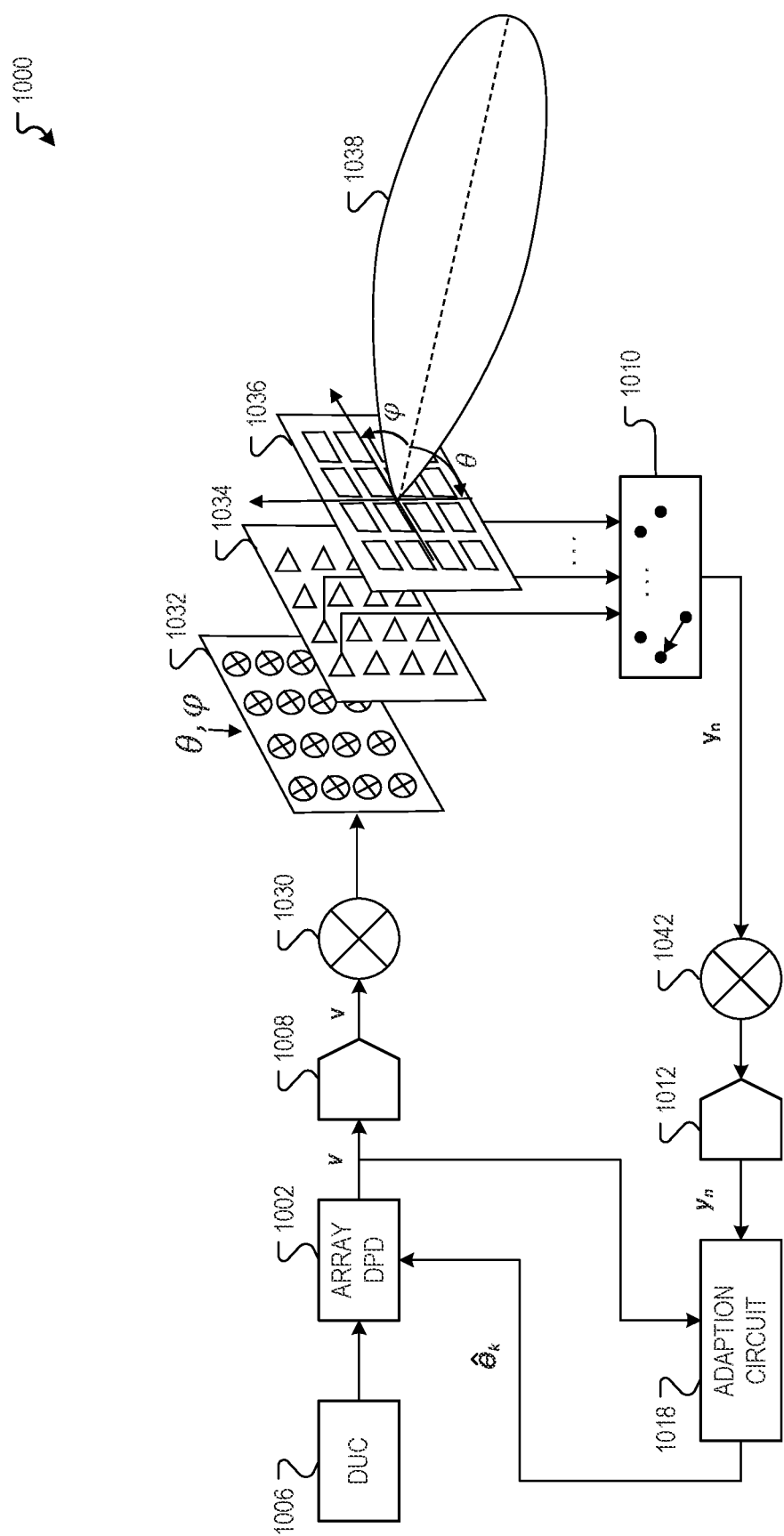
FIG. 10 is a diagram showing one example of an environment including an array of PAs and an array DPD circuit.

FIG. 10 is a diagram showing one example of an environment 1000 including an array 1034 of PAs and an array DPD circuit 1002. In the environment 1000 a single input signal (e.g., processed by the optional DUC 1006) is provided to the array DPD circuit 1002. The array DPD circuit 1002 generates a pre-distorted signal v. A DAC 1008 converts the pre-distorted signal v to an analog pre-distorted signal v. A mixer 1030 and mixer array 1032 mix the pre-distorted signal v with an array of values for a given downtilt angle θ and a horizontal scan angle φ to modify the amplitude and phase of the pre-distorted signal v. The mixer 1030 may be or include a frequency translation mixer that takes a lower-centered frequency signal (e.g., IF, such as about 100 MHz) and coverts it to a higher-centered frequency signal (e.g., about 30 GHz). The result of the mixer 1030 and mixer array 1032 may be a set of amplitude-modified and phase-shifted pre-distorted signals v, with each distinct signal being shifted by a phase and amplitude to bring about a transmission beam 1038 of a desired shape and direction. The phase-shifted and amplitude-modified pre-distorted signals are provided to PAs of a PA array 1034. The PAs of the PA array amplify their respective received signals, which are provided to separate antennas of an antenna array 1036. The phase shifting and amplitude modifying of the inputs to the PAs of the PA array result in a beam 1038 having the desired downtilt angle θ and horizontal scan angle φ.

In the arrangement of FIG. 10, the array DPD circuit 1002 may be trained in a manner similar to that described herein with respect to FIGS. 1 and 2. For example, a feedback switching circuit 1010 is configured to sequentially provide feedback signals $y_n$ from the PAs of the PA array 1034 to an adaption circuit 1018 via a, mixer 1042, and feedback ADC 1012. The mixer 1042 for example, man down-convert the feedback signals $y_n$, for example, as the inverse of the mixer 1030.

The adaption circuit 1018 may receive the feedback signals $y_n$ and the digital pre-distorted signal v from the output of the array DPD circuit 1002. The adaption circuit 1018 may perform time alignment to match or time align values of the feedback signal $y_n$ to corresponding values of the pre-distorted signal v. The adaption circuit 1018 generates predistortion parameters $\hat{\theta}_k$ for the array DPD circuit 1002 from the feedback signal $y_n$ and pre-distorted signal v, for example, as described herein with respect to FIG. 2.

Figure 11:
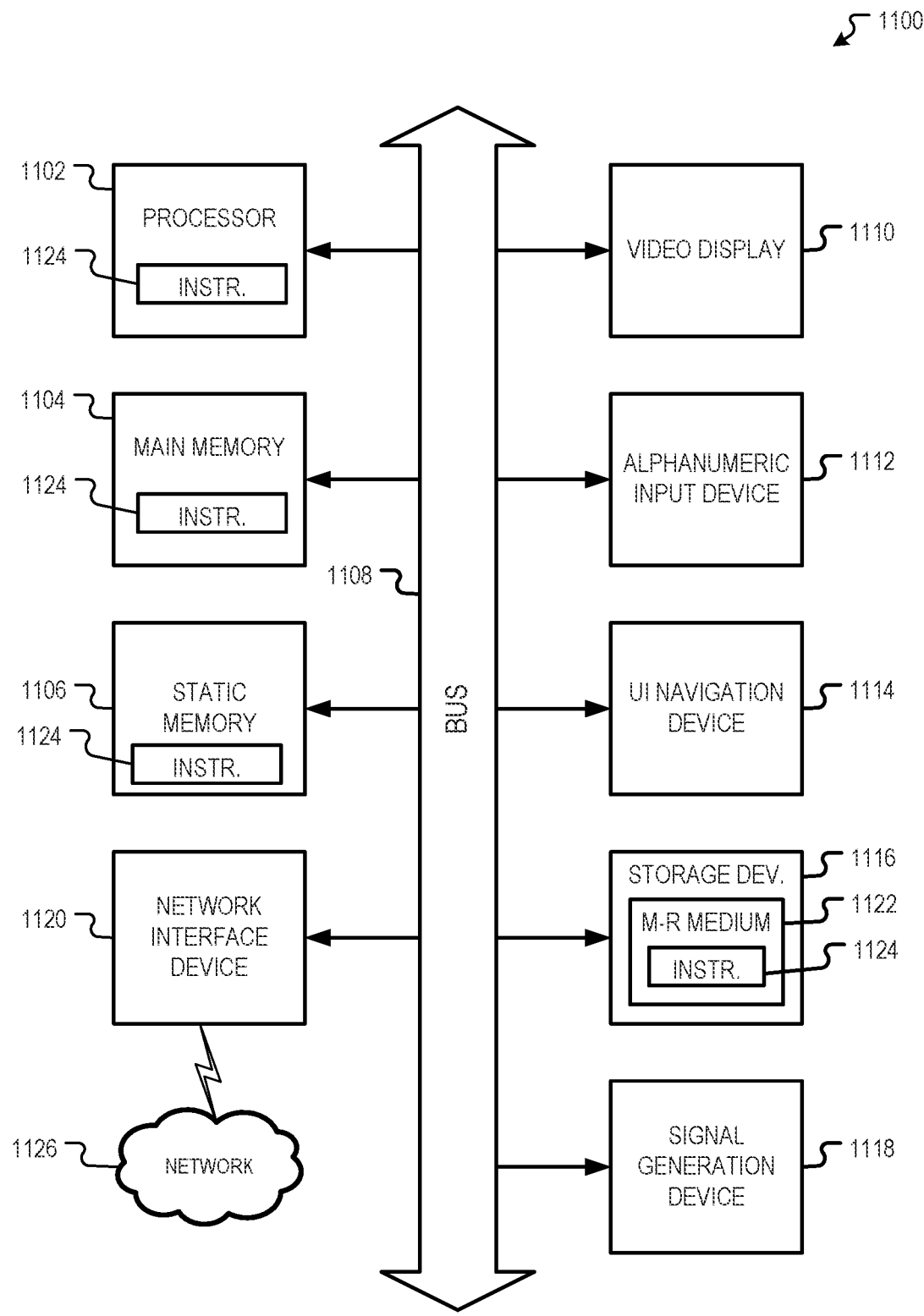
FIG. 11 is a block diagram illustrating a computing device hardware architecture, within which a set or sequence of instructions can be executed to cause a machine to perform examples of any one of the methodologies discussed herein.

FIG. 11 is a block diagram illustrating a computing device hardware architecture 1100, within which a set or sequence of instructions can be executed to cause a machine to perform examples of any one of the methodologies discussed herein. For example, the architecture 1100 may describe one or more digital signal processors (DSPs), application specific integrated circuits (ASICs), field programmable gate arrays (FPGAs), or similar hardware that may be used, in some examples, to implement any of the circuits described herein. For example, the DPD circuit 102, adaption circuit 118 may be implemented using all or portions of a hardware architecture such as the architecture 1100. The capture buffer 114 and time alignment circuit 116, in some examples, may also be implemented using all or portions of a hardware architecture such as the architecture 1100.

The architecture 1100 may operate as a standalone device or may be connected (e.g., networked) to other machines. In a networked deployment, the architecture 1100 may operate in the capacity of either a server or a client machine in server-client network environments, or it may act as a peer machine in peer-to-peer (or distributed) network environments. The architecture 1100 can be implemented in an embedded system, a personal computer (PC), a tablet PC, a hybrid tablet, a set-top box (STB), a personal digital assistant (PDA), a mobile telephone, a web appliance, a network router, a network switch, a network bridge, or any machine capable of executing instructions (sequential or otherwise) that specify operations to be taken by that machine.

The example architecture 1100 includes a processor unit 1102 comprising at least one processor (e.g., a central processing unit (CPU), a graphics processing unit (GPU), or both, processor cores, compute nodes). The architecture 1100 may further comprise a main memory 1104 and a static memory 1106, which communicate with each other via a link 1108 (e.g., a bus). The architecture 1100 can further include a video display unit 1110, an input device 1112 (e.g., a keyboard), and a UI navigation device 1114 (e.g., a mouse). In some examples, the video display unit 1110, input device 1112, and UI navigation device 1114 are incorporated into a touchscreen display. The architecture 1100 may additionally include a storage device 1116 (e.g., a drive unit), a signal generation device 1118 (e.g., a speaker), a network interface device 1120, and one or more sensors (not shown), such as a Global Positioning System (GPS) sensor, compass, accelerometer, or other sensor.

In some examples, the processor unit 1102 or another suitable hardware component may support a hardware interrupt. In response to a hardware interrupt, the processor unit 1102 may pause its processing and execute an TSR, for example, as described herein.

The storage device 1116 includes a machine-readable medium 1122 on which is stored one or more sets of data structures and instructions 1124 (e.g., software) embodying or used by any one or more of the methodologies or functions described herein. The instructions 1124 can also reside, completely or at least partially, within the main memory 1104, within the static memory 1106, and/or within the processor unit 1102 during execution thereof by the architecture 1100, with the main memory 1104, the static memory 1106, and the processor unit 1102 also constituting machine-readable media.

Executable Instructions and Machine-Storage Medium

The various memories (i.e., 1104, 1106, and/or memory of the processor unit(s) 1102) and/or the storage device 1116 may store one or more sets of instructions and data structures (e.g., the instructions 1124) embodying or used by any one or more of the methodologies or functions described herein. These instructions, when executed by the processor unit(s) 1102, cause various operations to implement the disclosed examples.

As used herein, the terms "machine-storage medium," "device-storage medium," and "computer-storage medium" (referred to collectively as "machine-storage medium") mean the same thing and may be used interchangeably. The terms refer to a single or multiple storage devices and/or media (e.g., a centralized or distributed database, and/or associated caches and servers) that store executable instructions and/or data, as well as cloud-based storage systems or storage networks that include multiple storage apparatus or devices. The terms shall accordingly be taken to include, but not be limited to, solid-state memories, and optical and magnetic media, including memory internal or external to processors. Specific examples of machine-storage media, computer-storage media, and/or device-storage media include non-volatile memory, including by way of example semiconductor memory devices, e.g., erasable programmable read-only memory (EPROM), electrically erasable programmable read-only memory (EEPROM), field-programmable gate array (FPGA), and flash memory devices; magnetic disks such as internal hard disks and removable disks; magneto-optical disks; and CD-ROM and DVD-ROM disks. The terms "machine-storage media," "computer-storage media," and "device-storage media" specifically exclude carrier waves, modulated data signals, and other such media, at least some of which are covered under the term "signal medium" discussed below.

Signal Medium

The term "signal medium" or "transmission medium" shall be taken to include any form of modulated data signal, carrier wave, and so forth. The term "modulated data signal" means a signal that has one or more of its characteristics set or changed in such a manner as to encode information in the signal.

Computer-Readable Medium

The terms "machine-readable medium," "computer-readable medium" and "device-readable medium" mean the same thing and may be used interchangeably in this disclosure. The terms are defined to include both machine-storage media and signal media. Thus, the terms include both storage devices/media and carrier waves/modulated data signals.

The instructions 1124 can further be transmitted or received over a communications network 1126 using a transmission medium via the network interface device 1120 using any one of a number of well-known transfer protocols (e.g., Hypertext Transfer Protocol (HTTP)). Examples of communication networks include a local area network (LAN), a wide area. network (WAN), the Internet, mobile telephone networks, plain old telephone service (POTS) networks, and wireless data networks (e.g., Wi-Fi, 3G, 4G Long-Term Evolution (LTE)/LTE-A, 5G, or WiMAX networks).

VARIOUS NOTES & EXAMPLES

Example 1 is a system for operating a plurality of power amplifiers, the system comprising: a predistortion circuit configured to pre-distort an input signal according to a predistortion configuration to generate a pre-distorted signal for the plurality of power amplifiers; and an adaption circuit, configured to perform operations comprising: receiving a first feedback signal from a first power amplifier of the plurality of power amplifiers; generating predistortion correlation data describing a correlation between parameters of a model describing the plurality of power amplifiers; receiving a first feedback signal from a second power amplifier of the plurality of power amplifiers; updating the predistortion correlation data to generate updated predistortion correlation data, the updating using the first feedback signal from the second power amplifier; and generating the predistortion configuration using the updated predistortion correlation data.

In Example 2, the subject matter of Example 1 optionally includes wherein generating the predistortion correlation data comprises: generating a first basis matrix using the first feedback signal of the first power amplifier and the pre-distorted signal; generating a first error vector using the first feedback signal of the first power amplifier and the pre-distorted signal; generating an autocorrelation matrix using the first basis matrix; and generating a cross-correlation vector using the first error vector.

In Example 3, the subject matter of Example 2 optionally includes wherein updating the predistortion correlation data comprises: generating a second basis matrix using the first feedback signal of the second power amplifier and the pre-distorted signal; generating a second error vector using the first feedback signal of the second power amplifier and the pre-distorted signal; generating an updated autocorrelation matrix using the second basis matrix and the autocorrelation matrix; and generating an updated cross-correlation vector using the second error vector and the cross-correlation vector.

In Example 4, the subject matter of Example 3 optionally includes wherein generating the predistortion configuration is based at least in part on the updated autocorrelation matrix and the updated cross-correlation vector.

In Example 5, the subject matter of any one or more of Examples 3-4 optionally includes wherein generating the predistortion configuration is based at least in part on a previous predistortion configuration, the updated autocorrelation matrix, and the updated cross-correlation vector.

In Example 6, the subject matter of any one or more of Examples 1-5 optionally includes a tilt equalizer circuit electrically coupled to the predistortion circuit to apply a frequency characteristic to the pre-distorted signal according to a tilt equalizer configuration, the operations further comprising: receiving a second feedback signal from the first power amplifier, the second feedback signal from the first power amplifier taken while the first power amplifier is biased to operate in a linear mode and while the predistortion circuit is deactivated; generating tilt equalizer correlation data describing a correlation between the plurality of power amplifiers and a tilt equalizer input signal using the second feedback signal of the first power amplifier; receiving a second feedback signal from the second power amplifier, the second feedback signal from the second power amplifier taken while the second power amplifier is biased to operate in a linear mode and while the predistortion circuit is deactivated; updating the tilt equalizer correlation data to generate updated tilt equalizer correlation data, the updating using the second feedback signal of the second power amplifier; and generating the tilt equalizer configuration for the tilt equalizer circuit using the updated tilt equalizer correlation data.

In Example 7, the subject matter of any one or more of Examples 1-6 optionally includes a tilt reference circuit electrically coupled prior to the predistortion circuit to apply a frequency characteristic to the pre-distorted signal according to a tilt reference configuration, the operations further comprising: receiving a third feedback signal of the first power amplifier, the third feedback signal from the first power amplifier taken while the first power amplifier is biased to operate in a linear mode and while the predistortion circuit is deactivated; generating, by the adaption circuit, tilt reference correlation data describing a correlation between the plurality of power amplifiers and a tilt reference input signal using the third feedback signal of the first power amplifier; receiving a third feedback signal of the second power amplifier, the third feedback signal from the second power amplifier taken while the second power amplifier is biased to operate in a linear mode and while the predistortion circuit is deactivated; updating, by the adaption circuit, the tilt reference correlation data to generate updated tilt reference correlation data, the updating using the third feedback signal of the second power amplifier; and generating, by the adaption circuit, a first tilt reference configuration for the tilt reference circuit using the updated tilt reference correlation data.

In Example 8, the subject matter of any one or more of Examples 1-7 optionally includes a beamforming circuit is positioned between the predistortion circuit and the first power amplifier, wherein the beamforming circuit is configured to perform operations comprising: applying a first amplitude modification and a first phase shift to the pre-distorted signal to generate a first modified pre-distorted signal; applying a second amplitude modification and a second phase shift to the pre-distorted signal to generate a second modified pre-distorted signal; providing the first modified pre-distorted signal to the first power amplifier; and providing the second modified pre-distorted signal to the second power amplifier.

Example 9 is a method for operating a predistortion circuit with a plurality of power amplifiers, the method comprising: configuring an adaption circuit to receive a first feedback signal from a first power amplifier of the plurality of power amplifiers; generating, by the adaption circuit, predistortion correlation data describing a correlation between parameters of a model describing the plurality of power amplifiers; configuring the adaption circuit to receive a first feedback signal from a second power amplifier of the plurality of power amplifiers; updating the predistortion correlation data, by the adaption circuit, to generate updated predistortion correlation data, the updating using the first feedback signal from the second power amplifier; generating, by the adaption circuit, a predistortion configuration for the predistortion circuit using the updated predistortion correlation data; generating, by the predistortion circuit, a pre-distorted signal based at least in part on the predistortion configuration; and providing the pre-distorted signal to the plurality of power amplifiers.

In Example 10, the subject matter of Example 9 optionally includes wherein generating the predistortion correlation data comprises: generating a first basis matrix using the first feedback signal of the first power amplifier and the pre-distorted signal; generating a first error vector using the first feedback signal of the first power amplifier and the pre-distorted signal; generating an autocorrelation matrix using the first basis matrix; and generating a cross-correlation vector using the first error vector.

In Example 11, the subject matter of Example 10 optionally includes wherein updating the predistortion correlation data comprises: generating a second basis matrix using the first feedback signal of the second power amplifier and the pre-distorted signal; generating a second error vector using the first feedback signal of the second power amplifier and the pre-distorted signal; generating an updated autocorrelation matrix using the second basis matrix and the autocorrelation matrix; and generating an updated cross-correlation vector using the second error vector and the cross-correlation vector.

In Example 12, the subject matter of Example 11 optionally includes wherein generating the predistortion configuration is based at least in part on the updated autocorrelation matrix and the updated cross-correlation vector.

In Example 13, the subject matter of any one or more of Examples 11-12 optionally includes wherein generating the predistortion configuration is based at least in part on a previous predistortion configuration, the updated autocorrelation matrix, and the updated cross-correlation vector.

In Example 14, the subject matter of any one or more of Examples 9-13 optionally includes configuring a tilt equalizer circuit electrically coupled between the predistortion circuit and the plurality of power amplifiers, the configuring of the tilt equalizer comprising: biasing the plurality of power amplifiers to operate in a linear mode; deactivating the predistortion circuit; configuring the adaption circuit to receive a second feedback signal from the first power amplifier; generating, by the adaption circuit, tilt equalizer correlation data describing a correlation between the plurality of power amplifiers and a tilt equalizer input signal using the second feedback signal of the first power amplifier; configuring the tilt equalizer circuit to receive a second feedback signal from the second power amplifier; updating, by the adaption circuit, the tilt equalizer correlation data to generate updated tilt equalizer correlation data, the updating using the second feedback signal of the second power amplifier; and generating, by the adaption circuit, a first tilt equalizer configuration for the tilt equalizer using the updated tilt equalizer correlation data.

In Example 15, the subject matter of any one or more of Examples 9-14 optionally includes configuring a tilt reference circuit electrically coupled prior to the predistortion circuit, the configuring of the tilt reference circuit comprising: biasing the plurality of power amplifiers to operate in a linear mode; deactivating the predistortion circuit; configuring the adaption circuit to receive a third feedback signal of the first power amplifier; generating, by the adaption circuit, tilt reference correlation data describing a correlation between the plurality of power amplifiers and a tilt reference input signal using the third feedback signal of the first power amplifier; configuring the tilt reference circuit to receive a third feedback signal of the second power amplifier; updating, by the adaption circuit, the tilt reference correlation data to generate updated tilt reference correlation data, the updating using the third feedback signal of the second power amplifier; and generating, by the adaption circuit, a first tilt reference configuration for the tilt reference circuit using the updated tilt reference correlation data.

In Example 16, the subject matter of any one or more of Examples 9-15 optionally includes wherein a beamforming circuit is positioned between the predistortion circuit and the first power amplifier, further comprising: applying, by the beamforming circuit, a first amplitude modification and a first phase shift to the pre-distorted signal to generate a first modified pre-distorted signal; applying, by the beamforming circuit, a second amplitude modification and a second phase shift to the pre-distorted signal to generate a second modified pre-distorted signal; providing the first modified pre-distorted signal to the first power amplifier; and providing the second modified pre-distorted signal to the second power amplifier.

Example 17 is a system for operating a plurality of power amplifiers, comprising: a first signal path for receiving a first feedback signal from a first power amplifier of the plurality of power amplifiers; means for generating predistortion correlation data describing a correlation between parameters of a model describing the plurality of power amplifiers; a second signal path for receiving a first feedback signal from a second power amplifier of the plurality of power amplifiers; means for updating the predistortion correlation data to generate updated predistortion correlation data, the updating using the first feedback signal from the second power amplifier; means for generating a predistortion configuration for a predistortion circuit using the updated predistortion correlation data; and means for generating a pre-distorted signal for providing to the plurality of power amplifiers based at least in part on the predistortion configuration.

In Example 18, the subject matter of Example 17 optionally includes means for receiving a second feedback signal from the first power amplifier, the second feedback signal from the first power amplifier taken while the first power amplifier is biased to operate in a linear mode and while the predistortion circuit is deactivated; means for generating tilt equalizer correlation data describing a correlation between the plurality of power amplifiers and a tilt equalizer input signal provided to a tilt equalizer, the generating using the second feedback signal of the first power amplifier; means for receiving a second feedback signal from the second power amplifier, the second feedback signal from the second power amplifier taken while the second power amplifier is biased to operate in a linear mode and while the predistortion circuit is deactivated; means for updating the tilt equalizer correlation data to generate updated tilt equalizer correlation data, the updating using the second feedback signal of the second power amplifier; and means for generating a tilt equalizer configuration using the updated tilt equalizer correlation data.

In Example 19, the subject matter of any one or more of Examples 17-18 optionally includes means for receiving a third feedback signal of the first power amplifier, the third feedback signal from the first power amplifier taken while the first power amplifier is biased to operate in a linear mode and while the predistortion circuit is deactivated; means for generating tilt reference correlation data describing a correlation between the plurality of power amplifiers and a tilt reference input signal using the third feedback signal of the first power amplifier; means for receiving a third feedback signal of the second power amplifier, the third feedback signal from the second power amplifier taken while the second power amplifier is biased to operate in a linear mode and while the predistortion circuit is deactivated; means for updating the tilt reference correlation data to generate updated tilt reference correlation data, the updating using the third feedback signal of the second power amplifier; and means for generating a first tilt reference configuration using the updated tilt reference correlation data.

In Example 20, the subject matter of any one or more of Examples 17-19 optionally includes means for applying a first amplitude modification and a first phase shift to the pre-distorted signal to generate a first modified pre-distorted signal; means for applying a second amplitude modification and a second phase shift to the pre-distorted signal to generate a second modified pre-distorted signal; means for providing the first modified pre-distorted signal to the first power amplifier; and means for providing the second modified pre-distorted signal to the second power amplifier.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In the event of inconsistent usages between this document and any documents so incorporated by reference, the usage in this document controls.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

Geometric terms, such as "parallel", "perpendicular", "round", or "square", are not intended to require absolute mathematical precision, unless the context indicates otherwise. Instead, such geometric terms allow for variations due to manufacturing or equivalent functions. For example, if an element is described as "round" or "generally round," a component that is not precisely circular (e.g., one that is slightly oblong or is a many-sided polygon) is still encompassed by this description.

The term "circuit" can include a dedicated hardware circuit, a general-purpose microprocessor, digital signal processor, or other processor circuit, and may be structurally configured from a general purpose circuit to a specialized circuit such as using firmware or software.

Any one or more of the techniques methodologies) discussed herein may be performed on a machine. In various embodiments, the machine may operate as a standalone device or may be connected (e.g., networked) to other machines. In a networked deployment, the machine may operate in the capacity of a server machine, a client machine, or both in server-client network environments. In an example, the machine may act as a peer machine in peer-to-peer (P2P) (or other distributed) network environment. The machine may be a personal computer (PC), a tablet PC, a set-top box (STB), a personal digital assistant (PDA), a mobile telephone, a web appliance, a network router, switch or bridge, or any machine capable of executing instructions (sequential or otherwise) that specify actions to be taken by that machine. Further, while only a single machine is illustrated, the term "machine" shall also be taken to include any collection of machines that individually or jointly execute a set (or multiple sets) of instructions to perform any one or more of the methodologies discussed herein, such as cloud computing, software as a service (SaaS), other computer cluster configurations.

Examples, as described herein, may include, or may operate by, logic or a number of components, or mechanisms. Circuit sets are a collection of circuits implemented in tangible entities that include hardware (e.g., simple circuits, gates, logic, etc.). Circuit set membership may be flexible over time and underlying hardware variability. Circuit sets include members that may, alone or in combination, perform specified operations when operating. In an example, hardware of the circuit set may be immutably designed to carry out a specific operation (e.g., hardwired). In an example, the hardware of the circuit set may include variably connected physical components (e.g., execution units, transistors, simple circuits, etc.) including a computer readable medium physically modified (e.g., magnetically, electrically, movable placement of invariant massed particles, etc.) to encode instructions of the specific operation. In connecting the physical components, the underlying electrical properties of a hardware constituent are changed, for example, from an insulator to a conductor or vice versa. The instructions can enable embedded hardware (e.g., the execution units or a loading mechanism) to create members of the circuit set in hardware via the variable connections to carry out portions of the specific operation when in operation, Accordingly, the computer readable medium is communicatively coupled to the other components of the circuit set member when the device is operating. In an example, any of the physical components may be used in more than one member of more than one circuit set. For example, under operation, execution units may be used in a first circuit of a first circuit set at one point in time and reused by a second circuit in the first circuit set, or by a third circuit in a second circuit set at a different time.

Particular implementations of the systems and methods described herein may involve use of a machine (e.g., computer system) that may include a hardware processor (e.g., a central processing unit (CPU), a graphics processing unit (GPU), a hardware processor core, or any combination thereof), a main memory and a static memory, some or all of which may communicate with each other via an interlink (e.g., bus). The machine may further include a display unit, an alphanumeric input device (e.g., a keyboard), and a user interface (UI) navigation device (e.g., a mouse). In an example, the display unit, input device and UI navigation device may be a touch screen display. The machine may additionally include a storage device (e.g., drive unit), a signal generation device (e.g., a speaker), a network interface device, and one or more sensors, such as a global positioning system (GPS) sensor, compass, accelerometer, or other sensor. The machine may include an output controller, such as a serial (e.g., universal serial bus (USB), parallel, or other wired or wireless (e.g., infrared (IR), near field communication (NFC), etc.) connection to communicate or control one or more peripheral devices (e.g., a printer, card reader, etc.).

The storage device may include a machine readable medium on which is stored one or more sets of data structures or instructions (e.g., software) embodying or utilized by any one or more of the techniques or functions described herein. The instructions may also reside, completely or at least partially, within the main memory, within static memory, or within the hardware processor during execution thereof by the machine. In an example, one or any combination of the hardware processor, the main memory, the static memory, or the storage device may constitute machine readable media.

While the machine readable medium can include a single medium, the term "machine readable medium" may include a single medium or multiple media (e.g., a centralized or distributed database, and/or associated caches and servers) configured to store the one or more instructions.

The term "machine readable medium" may include any medium that is capable of storing, encoding, or carrying instructions for execution by the machine and that cause the machine to perform any one or more of the techniques of the present disclosure, or that is capable of storing, encoding or carrying data structures used by or associated with such instructions. Non-limiting machine readable medium examples may include solid-state memories, and optical and magnetic media. In an example, a massed machine readable medium comprises a machine readable medium with a plurality of particles having invariant (e.g., rest) mass. Accordingly, massed machine-readable media are not transitory propagating signals. Specific examples of massed machine readable media may include: non-volatile memory, such as semiconductor memory devices (e.g., Electrically Programmable Read-Only Memory (EPROM), Electrically Erasable Programmable Read-Only Memory (EEPROM)) and flash memory devices; magnetic disks, such as internal hard disks and removable disks; magneto-optical disks; and CD-ROM and DVD-ROM disks.

The instructions may further be transmitted or received over a communications network using a transmission medium via the network interface device utilizing any one of a number of transfer protocols (e.g., frame relay, Internet protocol (IP), transmission control protocol (TCP), user datagram protocol (UDP), hypertext transfer protocol (HTTP), etc.). Example communication networks may include a local area network (LAN), a wide area network (WAN), a packet data network (e.g., the Internet), mobile telephone networks (e.g., cellular networks), Plain Old Telephone (POTS) networks, and wireless data networks (e.g., Institute of Electrical and Electronics Engineers (IEEE) 802.11 family of standards known as Wi-Fi®, IEEE 802.16 family of standards known as WiMax®), IEEE 802.15.4 family of standards, peer-to-peer (P2P) networks, among others. In an example, the network interface device may include one or more physical jacks (e.g., Ethernet, coaxial, or phone jacks) or one or more antennas to connect to the communications network. In an example, the network interface device may include a plurality of antennas to wirelessly communicate using at least one of single-input multiple-output (SEM), multiple-input multiple-output (MIMO), or multiple-input single-output (MISO) techniques. The term "transmission medium" shall be taken to include any intangible medium that is capable of storing, encoding or carrying instructions for execution by the machine, and includes digital or analog communications signals or other intangible medium to facilitate communication of such software.

Method examples described herein can be machine or computer-implemented at least in part. Some examples can include a computer-readable medium or machine-readable medium encoded with instructions operable to configure an electronic device to perform methods as described in the above examples. An implementation of such methods can include code, such as microcode, assembly language code, a higher-level language code, or the like. Such code can include computer readable instructions for performing various methods. The code may form portions of computer program products. Further, in an example, the code can be tangibly stored on one or more volatile, non-transitory, or non-volatile tangible computer-readable media, such as during execution or at other times. Examples of these tangible computer-readable media can include, but are not limited to, hard disks, removable magnetic disks, removable optical disks (e.g., compact disks and digital video disks), magnetic cassettes, memory cards or sticks, random access memories (RAMs), read only memories (ROMs), and the like.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description as examples or embodiments, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

What is claimed is:

1. A system for operating a plurality of power amplifiers, the system comprising:
   a predistortion circuit configured to pre-distort an input signal according to a predistortion configuration to generate a pre-distorted signal for the plurality of power amplifiers;
   a tilt equalizer circuit electrically coupled to the predistortion circuit to apply a frequency characteristic to the pre-distorted signal according to a tilt equalizer configuration; and
   an adaption circuit, configured to perform operations comprising:
   receiving a first feedback signal from a first power amplifier of the plurality of power amplifiers;
   generating predistortion correlation data describing a correlation between parameters of a model describing the plurality of power amplifiers, the generating of the predistortion correlation data using the first feedback signal from the first power amplifier;
   receiving a first feedback signal from a second power amplifier of the plurality of power amplifiers;
   updating the predistortion correlation data to generate updated predistortion correlation data, the updating using the first feedback signal from the second power amplifier and not using feedback from the first power amplifier;
   generating the predistortion configuration using the updated predistortion correlation data;
   receiving a second feedback signal from the first power amplifier, the second feedback signal from the first power amplifier taken while the first power amplifier is biased to operate in a linear mode and while the predistortion circuit is deactivated;
   generating tilt equalizer correlation data describing a correlation between the plurality of power amplifiers and a tilt equalizer input signal using the second feedback signal of the first power amplifier;
   receiving a second feedback signal from the second power amplifier, the second feedback signal from the second power amplifier taken while the second power amplifier is biased to operate in a linear mode and while the predistortion circuit is deactivated;
   updating the tilt equalizer correlation data to generate updated tilt equalizer correlation data, the updating using the second feedback signal of the second power amplifier; and
   generating the tilt equalizer configuration for the tilt equalizer circuit using the updated tilt equalizer correlation data.

2. The system of claim 1, wherein generating the predistortion correlation data comprises:
   generating a first basis matrix using the first feedback signal of the first power amplifier and the pre-distorted signal;
   generating a first error vector using the first feedback signal of the first power amplifier and the pre-distorted signal;
   generating an autocorrelation matrix using the first basis matrix; and
   generating a cross-correlation vector using the first error vector.

3. The system of claim 2, wherein updating the predistortion correlation data comprises:
   generating a second basis matrix using the first feedback signal of the second power amplifier and the pre-distorted signal;
   generating a second error vector using the first feedback signal of the second power amplifier and the pre-distorted signal;
   generating an updated autocorrelation matrix using the second basis matrix and the autocorrelation matrix; and
   generating an updated cross-correlation vector using the second error vector and the cross-correlation vector.

4. The system of claim 3, wherein generating the predistortion configuration is based at least in part on the updated autocorrelation matrix and the updated cross-correlation vector.

5. The system of claim 3, wherein generating the predistortion configuration is based at least in part on a previous predistortion configuration, the updated autocorrelation matrix, and the updated cross-correlation vector.

6. The system of claim 1, further comprising a tilt reference circuit electrically coupled prior to the predistortion circuit to apply a frequency characteristic to the pre-distorted signal according to a tilt reference configuration, the operations further comprising:
   receiving a third feedback signal of the first power amplifier, the third feedback signal from the first power amplifier taken while the first power amplifier is biased to operate in a linear mode and while the predistortion circuit is deactivated;
   generating, by the adaption circuit, tilt reference correlation data describing a correlation between the plurality of power amplifiers and a tilt reference input signal using the third feedback signal of the first power amplifier;
   receiving a third feedback signal of the second power amplifier, the third feedback signal from the second power amplifier taken while the second power amplifier is biased to operate in a linear mode and while the predistortion circuit is deactivated;

updating, by the adaption circuit, the tilt reference correlation data to generate updated tilt reference correlation data, the updating using the third feedback signal of the second power amplifier; and generating, by the adaption circuit, a first tilt reference configuration for the tilt reference circuit using the updated tilt reference correlation data.

7. The system of claim 1, further comprising a beamforming circuit is positioned between the predistortion circuit and the first power amplifier, wherein the beamforming circuit is configured to perform operations comprising:

applying a first amplitude modification and a first phase shift to the pre-distorted signal to generate a first modified pre-distorted signal;

applying a second amplitude modification and a second phase shift to the pre-distorted signal to generate a second modified pre-distorted signal;

providing the first modified pre-distorted signal to the first power amplifier; and providing the second modified pre-distorted signal to the second power amplifier.

8. A method for operating a predistortion circuit with a plurality of power amplifiers, the method comprising:

configuring an adaption circuit to receive a first feedback signal from a first power amplifier of the plurality of power amplifiers;

generating, by the adaption circuit, predistortion correlation data describing a correlation between parameters of a model describing the plurality of power amplifiers, the generating of the predistortion correlation data using the first feedback signal from the first power amplifier;

configuring the adaption circuit to receive a first feedback signal from a second power amplifier of the plurality of power amplifiers;

updating the predistortion correlation data, by the adaption circuit, to generate updated predistortion correlation data, the updating using the first feedback signal from the second power amplifier and not using feedback from the first power amplifier;

generating, by the adaption circuit, a predistortion configuration for the predistortion circuit using the updated predistortion correlation data;

configuring a tilt equalizer circuit electrically coupled between the predistortion circuit and the plurality of power amplifiers, the configuring of the tilt equalizer comprising:

biasing the plurality of power amplifiers to operate in a linear mode;

deactivating the predistortion circuit
configuring the adaption circuit to receive a second feedback signal from the first power amplifier;

generating, by the adaption circuit, tilt equalizer correlation data describing a correlation between the plurality of power amplifiers and a tilt equalizer input signal using the second feedback signal of the first power amplifier;

configuring the tilt equalizer circuit to receive a second feedback signal from the second power amplifier;

updating, by the adaption circuit, the tilt equalizer correlation data to generate updated tilt equalizer correlation data, the updating using the second feedback signal of the second power amplifier; and generating, by the adaption circuit, a first tilt equalizer configuration for the tilt equalizer using the updated tilt equalizer correlation data;

generating, by the predistortion circuit, a pre-distorted signal based at least in part on the predistortion configuration; and providing the pre-distorted signal to the plurality of power amplifiers.

9. The method of claim 8, wherein generating the predistortion correlation data comprises:

generating a first basis matrix using the first feedback signal of the first power amplifier and the pre-distorted signal;

generating a first error vector using the first feedback signal of the first power amplifier and the pre-distorted signal;

generating an autocorrelation matrix using the first basis matrix; and generating a cross-correlation vector using the first error vector.

10. The method of claim 9, wherein updating the predistortion correlation data comprises:

generating a second basis matrix using the first feedback signal of the second power amplifier and the pre-distorted signal;

generating a second error vector using the first feedback signal of the second power amplifier and the pre-distorted signal;

generating an updated autocorrelation matrix using the second basis matrix and the autocorrelation matrix; and generating an updated cross-correlation vector using the second error vector and the cross- correlation vector.

11. The method of claim 10, wherein generating the predistortion configuration is based at least in part on the updated autocorrelation matrix and the updated cross-correlation vector.

12. The method of claim 10, wherein generating the predistortion configuration is based at least in part on a previous predistortion configuration, the updated autocorrelation matrix, and the updated cross-correlation vector.

13. The method of claim 8, further comprising configuring a tilt reference circuit electrically coupled prior to the predistortion circuit, the configuring of the tilt reference circuit comprising:

biasing the plurality of power amplifiers to operate in a linear mode;

deactivating the predistortion circuit;

configuring the adaption circuit to receive a third feedback signal of the first power amplifier;

generating, by the adaption circuit, tilt reference correlation data describing a correlation between the plurality of power amplifiers and a tilt reference input signal using the third feedback signal of the first power amplifier;

configuring the tilt reference circuit to receive a third feedback signal of the second power amplifier;

updating, by the adaption circuit, the tilt reference correlation data to generate updated tilt reference correlation data, the updating using the third feedback signal of the second power amplifier; and generating, by the adaption circuit, a first tilt reference configuration for the tilt reference circuit using the updated tilt reference correlation data.

14. The method of claim 8, wherein a beamforming circuit is positioned between the predistortion circuit and the first power amplifier, further comprising:

applying, by the beamforming circuit, a first amplitude modification and a first phase shift to the pre-distorted signal to generate a first modified pre-distorted signal;

applying, by the beamforming circuit, a second amplitude modification and a second phase shift to the pre-distorted signal to generate a second modified pre-distorted signal;

providing the first modified pre-distorted signal to the first power amplifier; and providing the second modified pre-distorted signal to the second power amplifier.

15. A system for operating a plurality of power amplifiers, comprising:

a first signal path for receiving a first feedback signal from a first power amplifier of the plurality of power amplifiers;

means for generating predistortion correlation data describing a correlation between parameters of a model describing the plurality of power amplifiers, the generating of the predistortion correlation data using the first feedback signal from the first power amplifier;

a second signal path for receiving a first feedback signal from a second power amplifier of the plurality of power amplifiers;

means for updating the predistortion correlation data to generate updated predistortion correlation data, the updating using the first feedback signal from the second power amplifier and not using feedback from the first power amplifier;

means for generating a predistortion configuration for a predistortion circuit using the updated predistortion correlation data;

means for generating a pre-distorted signal for providing to the plurality of power amplifiers based at least in part on the predistortion configuration means for receiving a second feedback signal from the first power amplifier, the second feedback signal from the first power amplifier taken while the first power amplifier is biased to operate in a linear mode and while the predistortion circuit is deactivated;

means for generating tilt equalizer correlation data describing a correlation between the plurality of power amplifiers and a tilt equalizer input signal provided to a tilt equalizer, the generating using the second feedback signal of the first power amplifier;

means for receiving a second feedback signal from the second power amplifier, the second feedback signal from the second power amplifier taken while the second power amplifier is biased to operate in a linear mode and while the predistortion circuit is deactivated;

means for updating the tilt equalizer correlation data to generate updated tilt equalizer correlation data, the updating using the second feedback signal of the second power amplifier; and means for generating a tilt equalizer configuration using the updated tilt equalizer correlation data.

16. The system of claim 15, further comprising:

means for receiving a third feedback signal of the first power amplifier, the third feedback signal from the first power amplifier taken while the first power amplifier is biased to operate in a linear mode and while the predistortion circuit is deactivated;

means for generating tilt reference correlation data describing a correlation between the plurality of power amplifiers and a tilt reference input signal using the third feedback signal of the first power amplifier;

means for receiving a third feedback signal of the second power amplifier, the third feedback signal from the second power amplifier taken while the second power amplifier is biased to operate in a linear mode and while the predistortion circuit is deactivated;

means for updating the tilt reference correlation data to generate updated tilt reference correlation data, the updating using the third feedback signal of the second power amplifier; and means for generating a first tilt reference configuration using the updated tilt reference correlation data.

17. The system of claim 15, further comprising:

means for applying a first amplitude modification and a first phase shift to the pre-distorted signal to generate a first modified pre-distorted signal;

means for applying a second amplitude modification and a second phase shift to the pre-distorted signal to generate a second modified pre-distorted signal;

means for providing the first modified pre-distorted signal to the first power amplifier; and means for providing the second modified pre-distorted signal to the second power amplifier.

* * * * *

UNITED STATES PATENT AND TRADEMARK OFFICE
CERTIFICATE OF CORRECTION

PATENT NO. : 11,476,808 B2
APPLICATION NO. : 16/992902
DATED : October 18, 2022
INVENTOR(S) : Pratt et al.

Page 1 of 1

It is certified that error appears in the above-identified patent and that said Letters Patent is hereby corrected as shown below:

In the Claims

In Column 23, Line 51, in Claim 8, after "circuit", insert --;--

In Column 25, Line 32, in Claim 15, after "configuration", insert --;--

Signed and Sealed this
Fifteenth Day of August, 2023

Katherine Kelly Vidal
*Director of the United States Patent and Trademark Office*